United States Patent
Wang et al.

(10) Patent No.: US 8,814,329 B2
(45) Date of Patent: Aug. 26, 2014

(54) LIQUID EJECTING HEAD, LIQUID EJECTING APPARATUS, AND PIEZOELECTRIC ELEMENT

(71) Applicant: Seiko Epson Corporation, Tokyo (JP)

(72) Inventors: Xiaoxing Wang, Chino (JP); Kazuya Kitada, Suwa (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 13/649,330

(22) Filed: Oct. 11, 2012

(65) Prior Publication Data

US 2013/0093818 A1  Apr. 18, 2013

(30) Foreign Application Priority Data

Oct. 14, 2011 (JP) ................. 2011-227460

(51) Int. Cl.
  *B41J 2/045* (2006.01)
(52) U.S. Cl.
  USPC .......................................... 347/68

(58) Field of Classification Search
  None
  See application file for complete search history.

(56) References Cited

U.S. PATENT DOCUMENTS

2011/0037810 A1* 2/2011 Wang ............................ 347/68
2011/0221828 A1* 9/2011 Sakai et al. ................... 347/68

FOREIGN PATENT DOCUMENTS

JP  62-154680  7/1987
JP  2001-223404  8/2001

* cited by examiner

*Primary Examiner* — Matthew Luu
*Assistant Examiner* — Erica Lin
(74) *Attorney, Agent, or Firm* — Harness, Dickey & Pierce, P.L.C.

(57) ABSTRACT

A liquid ejecting head for discharging liquid from nozzle openings is provided. The liquid ejecting head includes a piezoelectric film and piezoelectric element with electrodes on the piezoelectric film. The piezoelectric film includes barium titanate-based composition having a perovskite structure containing barium, titanium, and copper less than or equal to 3 mol % of titanium amount.

11 Claims, 16 Drawing Sheets

1.00 μm 1.00 μm 1.00 μm

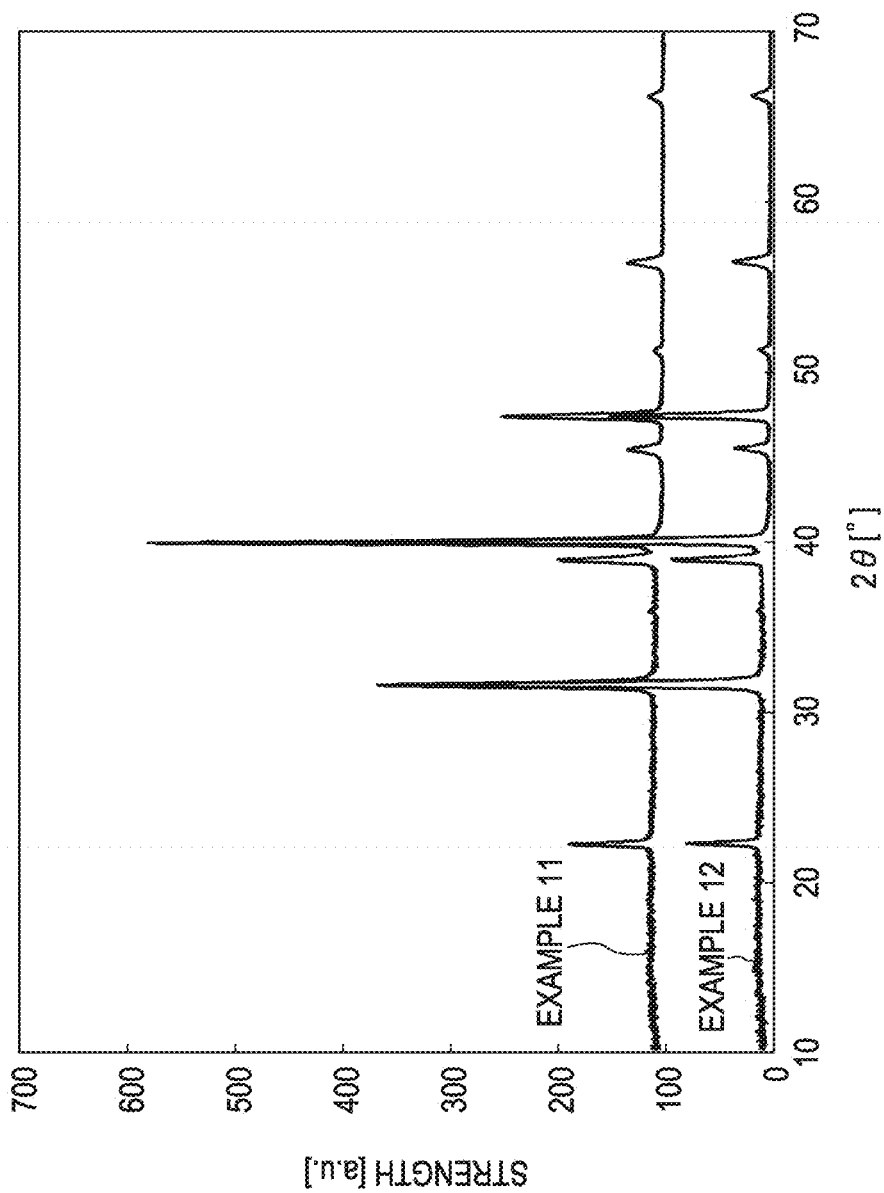

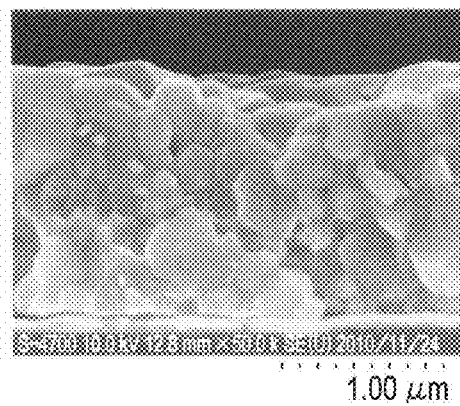
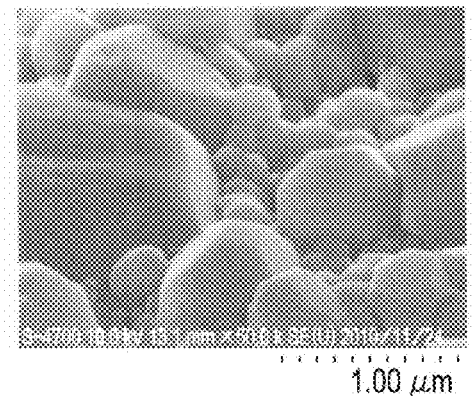
FIG. 15A
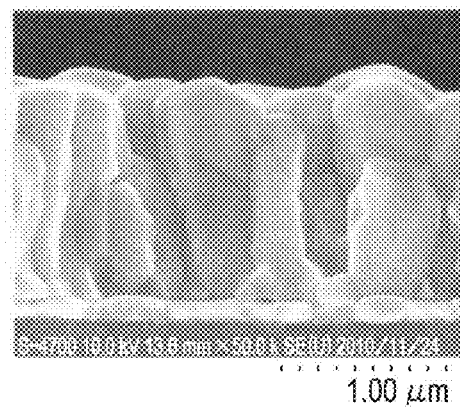
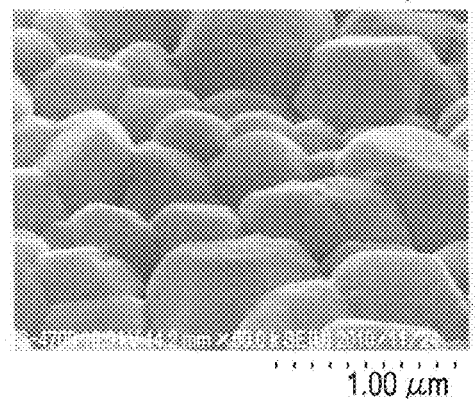
FIG. 15B

LIQUID EJECTING HEAD, LIQUID EJECTING APPARATUS, AND PIEZOELECTRIC ELEMENT

The entire disclosure of Japanese Patent Application No. 2011-227460, filed Oct. 14, 2011, is expressly incorporated by reference herein.

BACKGROUND

1. Technical Field

The present invention relates to a piezoelectric element made of a piezoelectric film and electrodes, a liquid ejecting head and a liquid ejecting apparatus which include the piezoelectric element and discharges liquid droplets from a nozzle opening.

2. Related Art

As a representative example of a liquid ejecting head, a part of a pressure generating chamber that communicates with a nozzle for discharging ink droplets is composed of a vibration plate, the vibration plate is deformed by a piezoelectric element, and ink of the pressure generating chamber is discharged, as ink droplets, from the nozzle by pressuring the ink. As the piezoelectric element used in the ink jet recording head, it is a piezoelectric film made from a piezoelectric material with an electromechanical transducing function, for example, a crystallized piezoelectric film and electrodes put on the both side of the piezoelectric film.

As methods of forming piezoelectric film, there are chemical solution methods, such as sol-gel, MOD (Motel Organic Deposition) method and so on, and physical method, such as sputtering method. Piezoelectric film can be created using these methods. For example, in case of using sol-gel method, organic metal compounds are dissolved in solvent to form colloidal solution, then it is coated on a substrate, the formed film is heated and crystallized to form a piezoelectric film.

Generally, a lead-based piezoelectric material represented by, for example, PZT (lead zirconate titanate) has been used for such a piezoelectric element (for example, see JP-A-2001-223404). However, from the viewpoint of environmental issues, a lead-free piezoelectric material or a piezoelectric material with a reduced amount of lead is required. As the lead-free piezoelectric material, a barium titanate-based composition oxide has been known for a long time (see JP-A-62-154680).

However, barium titanate-based composition has been mainly used as a piezoelectric bulk material. There is almost no practical study on barium titanate-based piezoelectric film formed by chemical method or physical method. In addition, barium titanate-based bulk is fabricated by mixing powder of metal oxides or metal carbonate at first, then calcining, grinding, forming the mixture and firing the formed body at 1000-1400° C., finally forming electrode on polished both side of the bulk. Therefore, stress caused by volume expansion and contraction of the ceramic at the time of manufacture is significantly small compared with that caused at the time of forming a piezoelectric film on a substrate by chemical solution method or sputtering method.

If the barium titanate-based material is used for a piezoelectric film on a substrate, there is a problem in that displacement is significantly small compared with that of the above-described PZT. It is also desirable to meet the needs of increasing density of barium titanate-based film, firing the film at low temperature and improving dielectric breakdown even when a high voltage is applied. That is to say, it is desirable to improve electric strength and so on. In addition, these problems are not only limited to liquid ejecting head represented by an ink jet recording head, but also exist in other piezoelectric elements.

SUMMARY

The purpose of the invention is to provide a liquid ejecting head and a liquid ejecting apparatus using a piezoelectric element with a piezoelectric film which has low environmental load and large displacement, as well as piezoelectric element.

An aspect of the invention to solve the above problem is a liquid ejecting head that drives liquid out from nozzle openings and includes a piezoelectric film and a piezoelectric element with electrodes on both side of the piezoelectric film. The liquid ejecting head is characterized with the barium titanate-based piezoelectric film with a perovskite structure containing barium, titanium, and copper less than or equal to 3 mol % of titanium amount.

In this way, displacement can be enhanced by using barium titanate-based piezoelectric material containing since the composition contains no lead or lead is suppressed, the environmental load can be reduced.

It is preferable that the piezoelectric film includes lithium more than or equal to 2 mol % and less than or equal to 5 mol % of titanium amount and boron more than or equal to 2 mol % and less than or equal to 5 mol % of titanium amount. According to it, both displacement and density can be improved. In addition, the liquid ejecting head may be made from materials with low heat-resistance because the piezoelectric layer can be fired at relatively low temperature.

It is preferable that the piezoelectric film consists of columnar crystals. According to it, dielectric breakdown of the piezoelectric film can be enhanced even when a high voltage is applied. That is to say, electric strength can be improved. Furthermore, crystal size can become uniform.

Another aspect of the invention is a liquid ejecting apparatus characterized with the above liquid ejecting head. According to the aspect, the liquid ejecting apparatus with low environmental load and large piezoelectric displacement can be realized because the piezoelectric layer used for the apparatus has low environmental load and excellent piezoelectric property.

BRIEF DESCRIPTION OF THE DRAWINGS

Another aspect of the invention is a piezoelectric element including piezoelectric film and electrodes on the piezoelectric film, wherein the piezoelectric film is made from barium titanate-based composition with a perovskite structure containing barium, titanium and copper below 3 mol % of titanium. According to the aspect, displacement can be improved by employing barium titanate-based material with addition of copper below 3 mol % of titanium amount. Furthermore, the environmental load can be reduced as the composition contains no lead or lead is suppressed.

FIG. 14 is a drawing showing an X-ray diffraction pattern according to an example.

FIGS. 15A and 15B are photographs obtained by observing a cross section and a surface of a piezoelectric film according to an example.

DESCRIPTION OF EXEMPLARY EMBODIMENTS

First Embodiment

Figure 1:
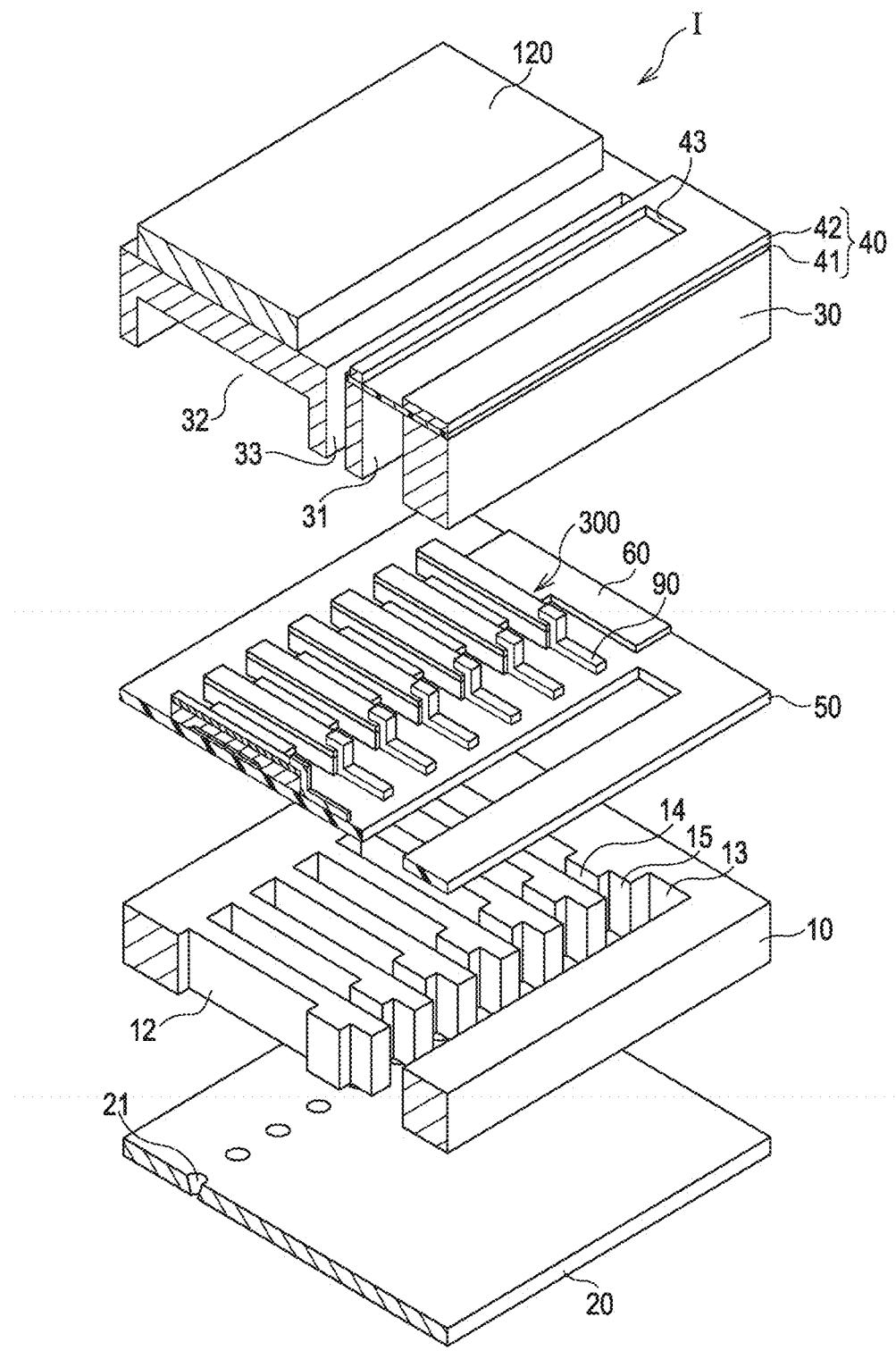
FIG. 1 is an exploded perspective view showing a schematic configuration of a recording head according to a first embodiment of the invention.
Figure 2:
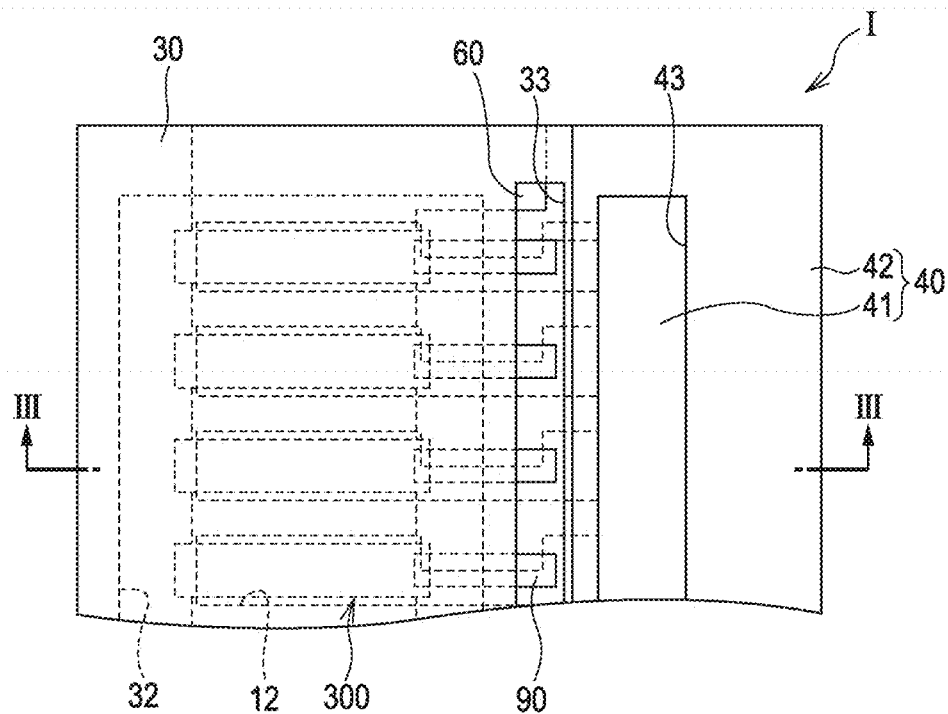
FIG. 2 is a plan view showing a recording head according to a first embodiment of the invention.
Figure 3:
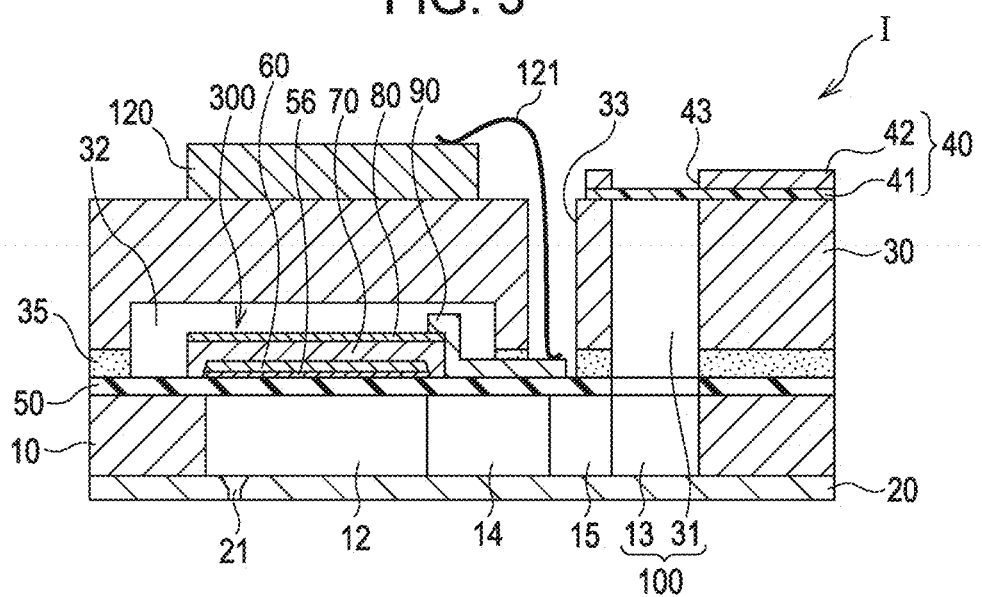
FIG. 3 is a cross-sectional view showing a recording head according to a first embodiment of the invention.

FIG. 1 is an exploded perspective view showing a schematic configuration of an ink jet recording head as an example of a liquid ejecting head according to a first embodiment of the invention, FIG. 2 is a plan view of FIG. 1, and FIG. 3 is a cross-sectional view of III-III line of FIG. 2. As shown in FIGS. 1 to 3, a flow passage forming substrate 10 according to the present embodiment includes a silicon single crystal substrate, and an elastic film 50 made of silicon dioxide is formed on a surface of the flow passage forming substrate 10.

On the flow passage forming substrate 10, a plurality of pressure generating chambers 12 are arranged in parallel in the width direction thereof. In addition, a communication portion 13 is formed on a region outside the pressure generating chamber 12 of the flow passage forming substrate 10 in the lengthwise direction, so that the communication portion 13 and each of the pressure generating chambers 12 are communicated with each other through an ink supply passage 14 and a communication passage 15 which are provided for each of the pressure generating chambers 12. The communication portion 13 constitutes a part of a manifold that becomes a common ink chamber of each of the pressure generating chambers 12 by being communicated with a manifold portion 31 of a protection substrate which will be described below. The ink supply passage 14 is formed with a narrower width than that of the pressure generating chamber 12, and therefore resistance to passage of ink that flows into the pressure generating chamber 12 from the communication portion 13 is kept constant. In addition, in the present embodiment, the ink supply passage 14 is formed by narrowing the width of the flow passage from one side, but the ink supply passage 14 may be formed by narrowing the width of the flow passage from both sides. In addition, the ink supply passage 14 may be formed by narrowing the flow passage in the thickness direction without narrowing the width of the flow passage. In the present embodiment, on the flow passage forming substrate 10, the pressure generating chambers 12, the communication portion 13, and a liquid flow passage including the ink supply passage 14 and the communication passage 15 are provided.

In addition, on an opening surface side of the flow passage forming substrate 10, a nozzle plate 20 through which nozzle openings 21 communicating with the vicinity of the end opposite to the ink supply passage 14 of each of the pressure generating chambers 12 are penetrated is fixed by an adhesive, a thermal weld film, or the like. In addition, the nozzle plate 20 is made of, for example, glass ceramics, silicon single crystal substrate, stainless steel, or the like.

Meanwhile, on the opposite surface of the opening surface of the flow passage forming substrate 10, the elastic film 50 is formed as described above, and on the elastic film 50, an adhesion layer 56 that is made of titanium oxide or the like having a thickness of about 20 nm to 50 nm and improves the adhesion with the base of the first electrode 60 such as the elastic film 50 or the like is provided. In addition, on the elastic film 50, an insulator film 50 that is made of zirconium oxide or the like may be provided, as necessary.

In addition, on the adhesion layer 56, the first electrode 60, a piezoelectric film 70 that is a thin film having a thickness of 3 μm or less, preferably, 0.5 μm to 1.5 μm and is formed in a chemical solution method or a sputtering method which will be described later, and a second electrode 80 are laminated, thereby constituting a piezoelectric element 300 acting as a pressure generating means that causes a pressure change in the pressure generating chamber 12. Here, the piezoelectric element 300 refers to a portion including the first electrode 60, the piezoelectric film 70, and the second electrode 80. In general, one electrode of the piezoelectric element 300 is used as a common electrode, and the other electrode and the piezoelectric film 70 are patterned for each of the pressure generating chambers 12 to thereby constitute the piezoelectric element 300. In the present embodiment, the first electrode 60 is used as the common electrode of the piezoelectric element 300, and the second electrode 80 is used as an individual electrode of the piezoelectric element 300, or vice versa depending on condition of a driving circuit or a wiring. In addition, here, a combination of the piezoelectric element 300 and a vibration plate in which displacement is caused by the driving of the piezoelectric element 300 is referred to as an actuator device. In addition, in the above-described example, the elastic film 50, the adhesion layer 56, the first electrode 60, and the insulator film which is provided as necessary act as the vibration plate, but the invention is not limited thereto. For example, the elastic film 50 or the adhesion layer 56 may not be provided. In addition, the piezoelectric element 300 itself may substantially act as the vibration plate.

In the invention, a piezoelectric material constituting the piezoelectric film 70 is a barium titanate-based piezoelectric material, that is, composite oxide having a perovskite structure containing barium (Ba) and titanium (Ti). In the perovskite structure, that is, an $ABO_3$ type structure, A has 12-coordination with oxygen, and B has 6-coordination with oxygen, thereby forming an octahedron. Ba is located at the site of A, and Ti is located at the site of B. In addition, when expressed as barium titanate in the invention, as long as basic characteristics of a corresponding composition are not changed, the composition may be included in the range of the barium titanate even though the composition is shifted from the stoichiometric composition ($BaTiO_3$) due to defects or excessive addition of constituent elements (Ba, Ti, O).

In addition, in the invention, almost all of the composite oxide constituting the piezoelectric film 70 is barium titanate (for example, $BaTiO_3$), and therefore the composite oxide may further contain a small amount of copper (Cu). The content of Cu is less than or equal to 3 mol % with respect to Ti. In this manner, the thin-film piezoelectric film 70 containing Cu at less than or equal to 3 mol % with respect to Ti is made of the barium titanate-based composite oxide, and therefore it is possible to significantly improve an amount of distortion. In addition, it is possible to improve the amount of distortion by Cu being contained, and the piezoelectric film 70 containing Cu at greater than or equal to 0.5 mol % with respect to Ti is used, and therefore it has been confirmed that the amount of distortion is improved.

In addition, as shown in the embodiment which will be described below, when a proportion of Cu is 1 mol % or less with respect to Ti, the piezoelectric film 70 in which a heterogenous phase different from the perovskite structure is not detected may be used. When the piezoelectric film 70 which does not have the heterogenous phase is used, the amount of distortion may be further improved compared to the piezoelectric film having the heterogenous phase.

In addition, it is preferable that the composite oxide constituting the piezoelectric film 70 contain lithium (Li) at greater than or equal to 2 mol % and less than or equal to 5 mol % with respect to Ti, and boron (B) at greater than or equal to 2 mol % and less than or equal to 5 mol % based on the Ti. In this manner, almost all is the barium titanate, and the composite oxide contains Cu at less than or equal to 3 mol % with respect to Ti, Li at greater than or equal to 2 mol % and less than or equal to 5 mol % with respect to Ti, and B at greater than or equal to 2 mol % and less than or equal to 5 mol % based on the Ti are contained, and therefore the amount of distortion is improved, and denseness of the piezoelectric film 70 is improved. In addition, details will be described below, but the piezoelectric film 70 may be fired at a low temperature to thereby be crystallized when being manufactured in the chemical solution method or the sputtering method. Accordingly, a liquid ejecting head using a member that has low heat-resistance may be obtained.

In addition, the piezoelectric film 70 has the perovskite structure despite containing Cu, Li, or B. The Cu, Li, and B substitute a portion of Ba of the A sites or Ti of the B sites. Alternatively, the Cu, Li, and B are assumed to be present at the interface of grains.

Here, as described in JP-A-62-154680, with respect to the barium titanate-based piezoelectric material, various studies about bulk have been made, but the piezoelectric material of the bulk is very small, and thereby shows a different behavior from the thin-film piezoelectric material which is generally formed in the chemical solution method or the sputtering method. Accordingly, it is difficult for the piezoelectric material of the bulk to be put into use for the thin-film piezoelectric material.

In addition, the piezoelectric film 70 is not made of granular crystals, but preferably made of columnar crystals. When the piezoelectric film 70 is made of the columnar crystals, pressure resistance may be improved, and a crystal grain diameter of the piezoelectric film 70 is uniformized.

A lead electrode 90 that is made of, for example, gold (Au) or the like, led out from the vicinity of the end of the ink supply passage 14 side, and extending onto the elastic film 50 or the insulator film provided, as necessary, is connected to each of the second electrodes 80 that is an individual electrode of the piezoelectric element 300.

On the flow passage forming substrate 10 on which the above-described piezoelectric element 300 is formed, that is, on the first electrode 60, the elastic film 50, the insulator film provided, as necessary, and the lead electrode 90, a protection substrate 30 having a manifold portion 31 constituting at least a part of a manifold 100 is bonded through an adhesive 35. In the present embodiment, the manifold portion 31 is formed over a width direction of the pressure generating chamber 12 while penetrating through the protection substrate 30 in the thickness direction, and communicated with the communication portion 13 of the flow passage forming substrate 10 as described above to thereby constitute the manifold 100 that becomes a common ink chamber of each of the pressure generating chambers 12. In addition, the communication portion 13 of the flow passage forming substrate 10 is divided into a plurality of numbers for each of the pressure generating chambers 12, and only the manifold portion 31 may be used as the manifold. In addition, for example, only the pressure generating chambers 12 are provided on the flow passage forming substrate 10, and the ink supply passage 14 that enables the manifold 100 and each of the pressure generating chambers 12 to be communicated with each other may be provided on a member (for example, the elastic film 50, the insulator film provided, as necessary, or the like) interposed between the flow passage forming substrate 10 and the protection substrate 30.

In addition, on a region that faces the piezoelectric element 300 of the protection substrate 30, a piezoelectric element holding portion 32 having a space to the extent not to hinder the motion of the piezoelectric element 300 is provided. It is sufficient when the piezoelectric element holding portion 32 has the space to the extent not to hinder the motion of the piezoelectric element 300, and the space may be sealed or not be sealed.

As a material of the protection substrate 30, it is preferable that substantially the same material as that having a thermal expansion coefficient of the flow passage forming substrate 10, for example, glass, a ceramic material, or the like be used, and in the present embodiment, the protection substrate 30 is formed using a silicon single crystal substrate with the same material as that of the flow passage forming substrate 10.

In addition, on the protection substrate 30, a through-hole 33 that penetrates the protection substrate 30 in the thickness direction is provided. The vicinity of the end of the lead electrode 90 that is led out from each of the piezoelectric elements 300 is provided so as to be exposed in the through-hole 33.

In addition, on the protection substrate 30, a driving circuit 120 for driving the piezoelectric elements 300 arranged in parallel is fixed. As the driving circuit 120, for example, a circuit board, a semiconductor integrated circuit (IC), or the like may be used. The driving circuit 120 and the lead electrode 90 are electrically connected to each other through a connection wiring 121 including a conductive wire such as a bonding wire or the like.

In addition, on the protection substrate 30, a compliance substrate 40 including a sealing film 41 and a fixing plate 42 is bonded. Here, the sealing film 41 is made of a material having low rigidity with flexibility, and one side surface of the manifold portion 31 is sealed by the sealing film 41. In addition, the fixing plate 42 is made of a relatively hard material. Since a region of the fixing plate 42 that faces the manifold 100 is an opening 43 that is completely removed in the thickness direction, one side surface of the manifold 100 is sealed only by the sealing film 41 having flexibility.

In the ink jet recording head I according to the embodiment described above, ink is taken in from an ink inlet opening that is connected with an external ink supply means which is not shown, an inside of the ink jet recording head is filled with the ink while reaching from the manifold 100 to the nozzle opening 21, and then the elastic film 50, the adhesion layer 56, the first electrode 60, and the piezoelectric film 70 are bent and deformed by applying a voltage between each of the first electrodes 60 and each of the second electrodes 80 corresponding to the pressure generating chamber 12 in accordance with a recording signal from the driving circuit 120, and therefore ink droplets are discharged from the nozzle openings 21 due to an increased pressure in each of the pressure generating chambers 12.

Next, an example of a manufacturing method of the ink jet recording head according to the present embodiment will be described with reference to FIGS. 4A to 8B. In addition, FIG. 4A to 8B are cross-sectional views of the pressure generating chamber in the longitudinal direction.

Figure 4A:
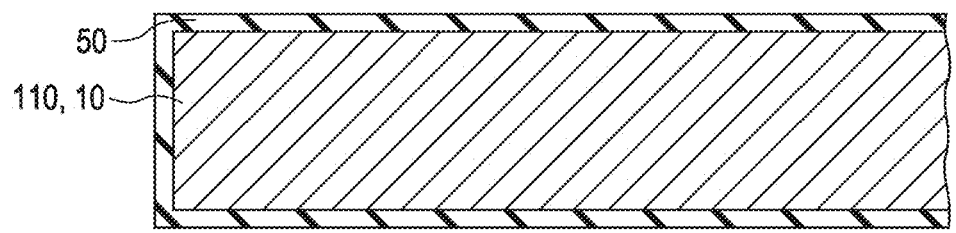
FIGS. 4A and 4B are cross-sectional views showing a manufacturing process of a recording head according to a first embodiment of the invention.
Figure 4B:
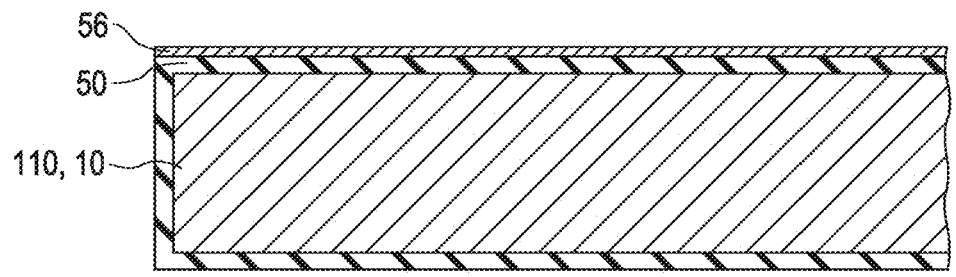

First, as shown in FIG. 4A, on a surface of a wafer 110 for the flow passage forming substrate that is a silicon wafer, a silicon dioxide film including silicon dioxide ($SiO_2$) or the like constituting the elastic film 50 is formed through thermal oxidation. Subsequently, as shown in FIG. 4B, on the elastic film 50 (the silicon dioxide film), the adhesion layer 56 including titanium oxide or the like is formed using the sputtering method or thermal oxidation.

Figure 5A:
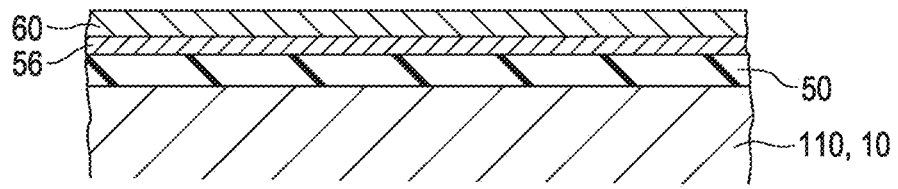
FIGS. 5A to 5C are cross-sectional views showing a manufacturing process of a recording head according to a first embodiment of the invention.
Figure 5B:
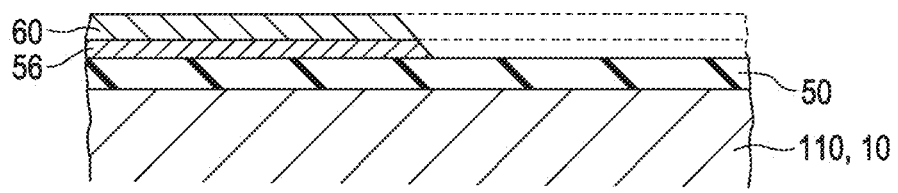

Next, as shown in FIG. 5A, on the entire surface of the adhesion layer 56, the first electrode 60 including platinum, iridium, iridium oxide, or a laminated structure thereof may be formed by the sputtering method or a deposition method. Next, as shown in FIG. 5B, on the first electrode 60, a resist (not shown) of a predetermined shape as a mask is simultaneously patterned so that side surfaces of the adhesion layer 56 and the first electrode 60 are inclined.

Next, after stripping the resist, the thin-film piezoelectric film 70 is laminated on the first electrode 60. The piezoelectric film 70 may be manufactured using a metal-organic decomposition (MOD) method in which the piezoelectric film (a piezoelectric body film) made of metal oxide is obtained in such a manner that a solution containing a metal complex is applied and dried, and fired and crystallized at a high temperature or a chemical solution deposition method such as a sol-gel method. Other than this, the piezoelectric film 70 may be manufactured in the sputtering method.

Figure 5C:
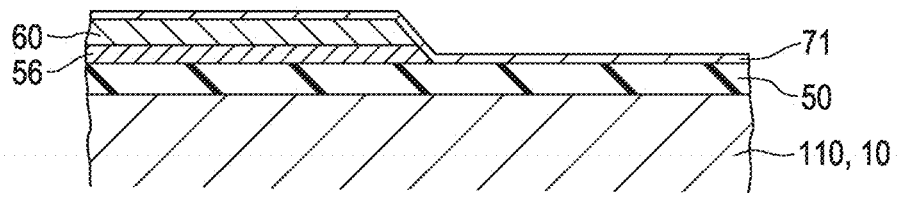

As a specific example of a forming procedure when forming the piezoelectric film 70 using the chemical solution method, first, a metal complex, specifically, a metal complex solution containing Ba, Ti, and Cu, that is, a precursor solution for forming the piezoelectric film (hereinafter, also described as a "precursor solution") that includes an MOD solution or sol in a ratio to be an intended composition ratio, specifically, in a ratio in which nearly all is barium titanate and composite oxide containing Cu at less than or equal to 3 mol % with respect to Ti is formed is applied on the first electrode 60, as shown in FIG. 5C, using a spin coating method or the like to thereby form a piezoelectric body precursor film 71 (an application process).

The applied precursor solution is obtained in such a manner that the metal complexes capable of forming the composite oxide containing Ba, Ti, and Cu are mixed, and the mixture is dissolved or dispersed in an organic solvent. In addition, when forming the piezoelectric film 70 including the composite oxide containing Li and B, a precursor solution containing the metal complex having Li or B is used. Each of the metal complexes containing Ba, Ti, and Cu or the metal complex having mixed Li and B, as necessary, may be mixed in a desired molar ratio of each metal. As each of the metal complexes containing Bi, Ti, Cu, Li, and B, for example, alkoxides, organic acid salts, β-diketone complexes, or the like may be used. As the metal complex containing Ba, for example, barium 2-ethylhexanoate, barium isopropoxide, and barium acetylacetonate, or the like may be used. As the metal complex containing Ti, for example, titanium 2-ethylhexanoate, titanium isopropoxide, titanium (di-i-propoxide) bis(acetylacetonate), or the like may be used. As the metal complex containing Cu, for example, copper 2-ethylhexanoate or the like may be used. As an organic metal compound containing Li, for example, lithium 2-ethylhexanoate or the like may be used. As an organic metal compound containing B, for example, boron 2-ethylhexanoate or the like may be used. Obviously, the metal complexes containing two or more kinds of Ba, Ti, Cu, or Li and B which are included, as necessary, may be used. As a solvent of the precursor solution, propanol, butanol, pentanol, hexanol, octanol, ethylene glycol, propylene glycol, octane, decane, cyclohexane, xylene, toluene, and tetrahydrofuran may be used.

Subsequently, the piezoelectric body precursor film 71 is heated at a predetermined temperature (e.g., 150° C. to 200° C.) and dried for a predetermined time (a drying process). Next, the dried piezoelectric body precursor film 71 is heated at a predetermined temperature (e.g., 350° C. to 450° C.) and maintained for a predetermined time to thereby be degreased (a degreasing process). The degreasing referred to here is to remove organic components included in the piezoelectric body precursor film 71. An atmosphere of the drying process or the degreasing process is not limited, and one of air, an oxygen atmosphere, and an inert gas may be used. In addition, the application process, the drying process, the degreasing process may be performed multiple times.

Figure 6A:
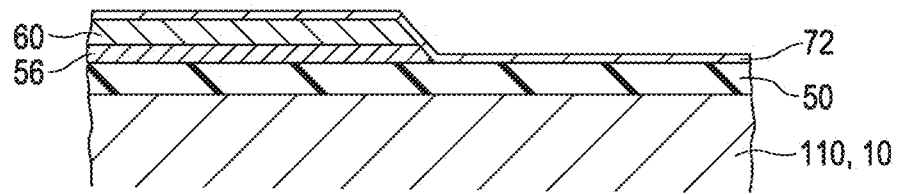
FIGS. 6A and 6B are cross-sectional views showing a manufacturing process of a recording head according to a first embodiment of the invention.

Next, as shown in FIG. 6A, the piezoelectric body precursor film 71 is heated at, for example, about 600° C. to 950° C., and maintained for a predetermined time, for example, 1 to 60 minutes to thereby be crystallized, and therefore a piezoelectric body film 72 including a composite oxide having a perovskite structure that contains Ba, Ti, and Cu of 3 mol % or less with respect to Ti is formed as a barium titanate-based composite oxide (a firing process). In addition, before the crystallization process, a temporary firing for heating at a temperature of about 450° C. to 550° C. for a predetermined time may be performed. An atmosphere of the firing process is preferably an oxygen atmosphere. As a heating device used in the drying process, the degreasing process, and the firing process, for example, a rapid thermal annealing (RTA) device that is heated by irradiation of an infrared lamp, an electric furnace, a hot plate, or the like may be used.

Figure 6B:
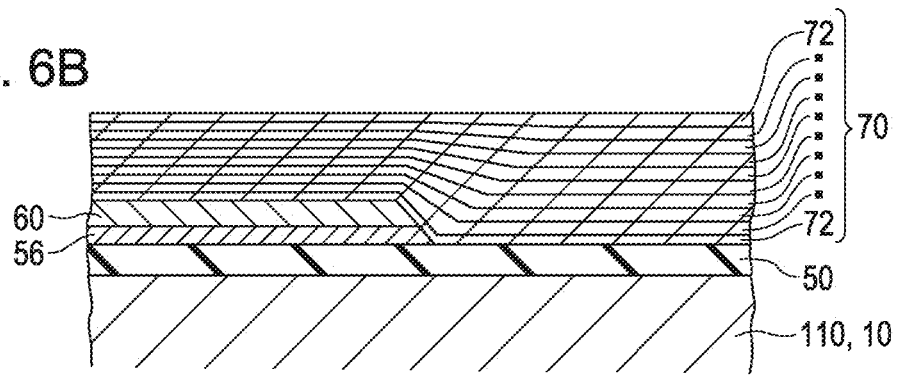

Next, the piezoelectric film 70 including a plurality of piezoelectric body films 72 is formed by performing the above-described application process, drying process, and degreasing process, or the application process, the drying process, the degreasing process, and the firing process multiple times in accordance with a desired film thickness or the like, and therefore the piezoelectric film 70 having a predetermined thickness, which includes a plurality of piezoelectric body films 72 as shown in FIG. 6B, is formed. For example, when a film thickness of a coating solution per one time is about 0.1 μm, the overall film thickness of the piezoelectric film 70 including the piezoelectric body films 72 of ten layers is about 1.1 μm. In addition, in the present embodiment, the piezoelectric body films 72 are laminated, but the piezoelectric body film 72 of only one layer may be used.

In addition, when the barium titanate-based composite oxide containing the above-predetermined amount of Cu, Li, and B is formed using a raw material containing Ba, Ti, and Cu, and a raw material further containing Li and B, crystallization is carried out at a low temperature, and dense crystals are obtained, and therefore the firing process may be performed at a low temperature (a firing temperature). Obviously, if there is no trouble regarding the other members, the firing process may be performed at a high temperature.

In addition, in a method in which the piezoelectric body precursor film 71 is applied and then the firing process is performed without the application process performed therebetween, the piezoelectric body films 72 are formed and laminated. That is, by performing the application process, the drying process, the degreasing process, and the firing process for each layer, the piezoelectric body films 72 are laminated to thereby form the piezoelectric film 70, and therefore the piezoelectric film 70 that is made of not granular crystals, but columnar crystals.

Figure 7A:
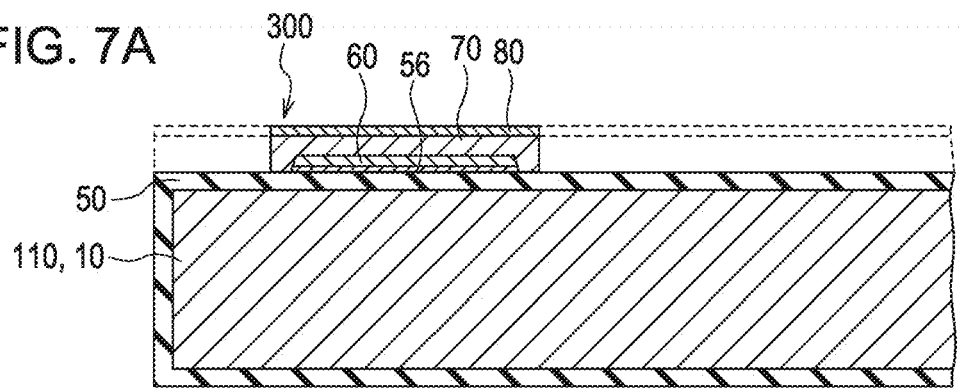
FIGS. 7A to 7C are cross-sectional views showing a manufacturing process of a recording head according to a first embodiment of the invention.

In this manner, after the piezoelectric film 70 is formed, the second electrode 80 made of platinum or the like is formed on the piezoelectric film 70 using the sputtering method as shown in FIG. 7A, and the piezoelectric film 70 and the second electrode 80 are simultaneously patterned on a region facing each of the pressure generating chambers 12 to thereby form the piezoelectric element 300 including the first electrode 60, the piezoelectric film 70, and the second electrode 80. In addition, the patterning of the piezoelectric film 70 and the second electrode 80 is performed in a lump by performing dry etching through a resist (not shown) formed in a predetermined shape. Thereafter, annealing may be carried out in a temperature range, for example, 500° C. to 800° C., as necessary. Therefore, a superior interface between the piezoelectric film 70 and the first electrode 60 or the second electrode 80 may be formed, and crystallinity of the piezoelectric film 70 may be improved.

Figure 7B:
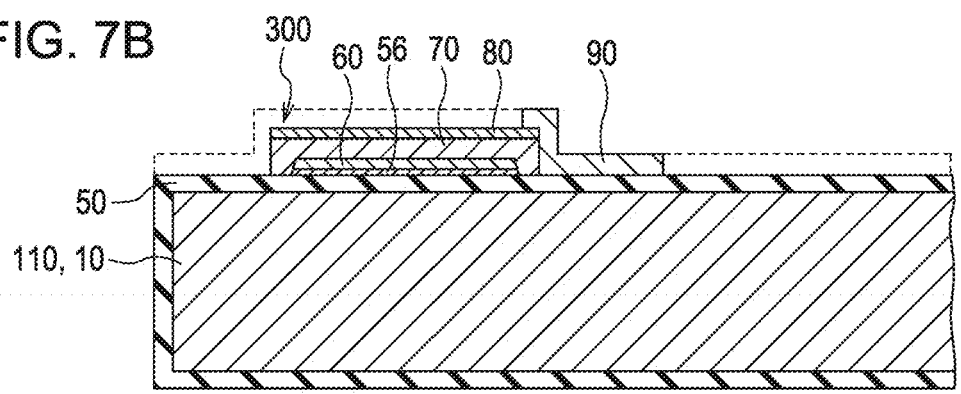

Next, as shown in FIG. 7B, the lead electrode 90 made of gold (Au) or the like is formed over the entire surface of the wafer 110 for the flow passage forming substrate, and then patterning is carried out for each of the piezoelectric elements 300 through a mask pattern (not shown) made of, for example, a resist or the like.

Figure 7C:
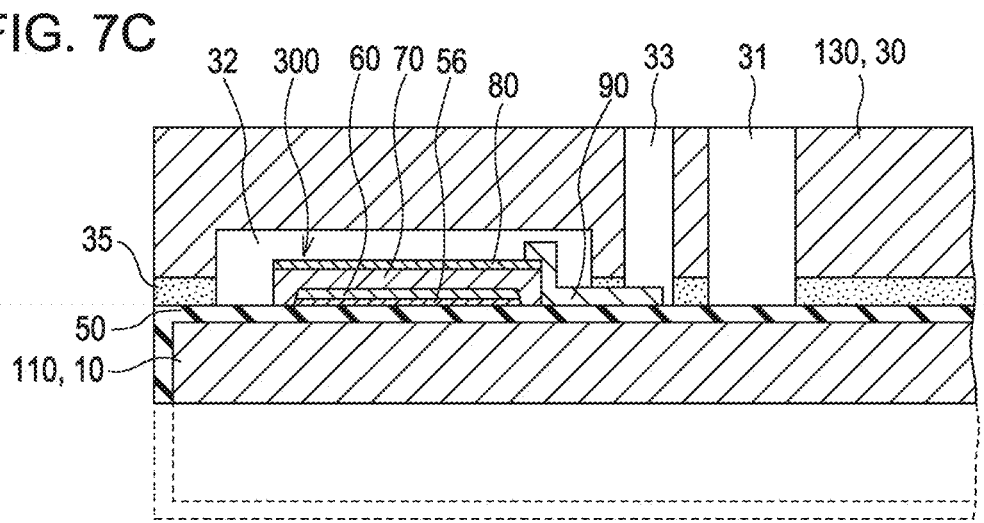

Next, as shown in FIG. 7C, on the piezoelectric element 300 side of the wafer 110 for the flow passage forming substrate, a wafer 130 for the protection substrate that is a silicon wafer and a plurality of protection substrates 30 is bonded through an adhesive 35, and then the wafer 110 for the flow passage forming substrate is thinned to have a predetermined thickness.

Figure 8A:
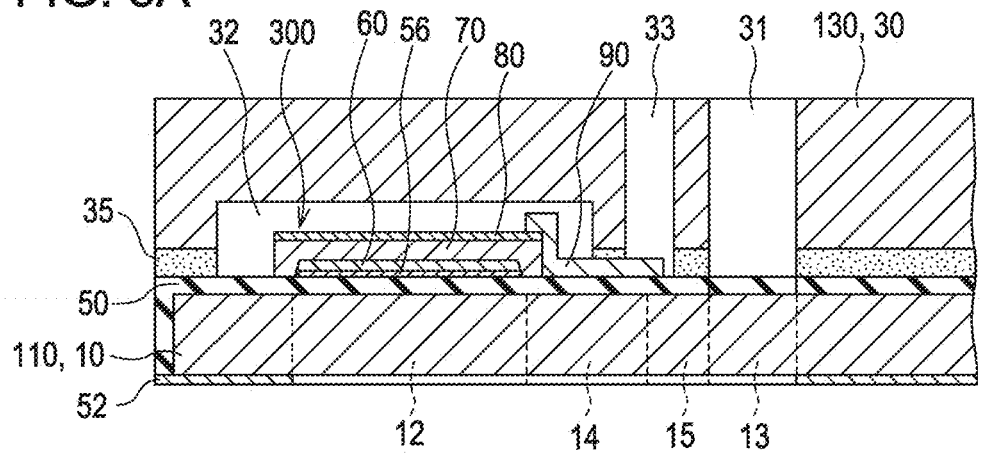
FIGS. 8A and 8B are cross-sectional views showing a manufacturing process of a recording head according to a first embodiment of the invention.

Next, as shown in FIG. 8A, on the wafer 110 for the flow passage forming substrate, a mask film 52 is newly formed, and patterned into a predetermined shape.

Figure 8B:
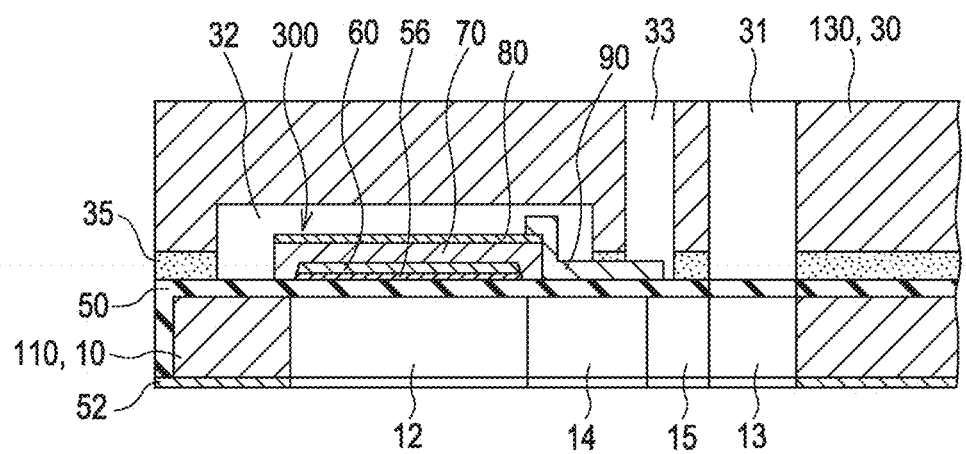

Next, as shown in FIG. 8B, the wafer 110 for the flow passage forming substrate is subjected to anisotropic etching (wet etching) using an alkaline solution such as KOH or the like through the mask film 52, and therefore the pressure generating chamber 12, the communication portion 13, the ink supply passage 14, the communication passage 15, and the like which correspond to the piezoelectric element 300 are formed.

Thereafter, unnecessary portions of the outer peripheral edge of the wafer 110 for the flow passage forming substrate and the wafer 130 for the protection substrate are cut to thereby be removed, for example, by dicing or the like. Next, the mask film 52 of a surface of the wafer 110 for the flow passage forming substrate which is opposite to the wafer 130 for the protection substrate is removed, the compliance substrate 40 is bonded to the wafer 130 for the protection substrate while bonding the nozzle plate 20 through which the nozzle openings 21 are penetrated, and the wafer 110 for the flow passage forming substrate or the like is divided into the flow passage forming substrates 10 or the like in one chip size as shown in FIG. 1, thereby obtaining the ink jet recording head I of the present embodiment.

EXAMPLES

Hereinafter, the invention will be described in more detail while describing Examples. In addition, the invention is not limited to the following examples.

Example 1

First, a silicon oxide ($SiO_2$) film was formed on a surface of a (100) single crystal silicon (Si) substrate by thermal oxidation. Next, titanium oxide with a thickness of 40 nm was laminated on the $SiO_2$ film, and a platinum film (the first electrode 60) with a thickness of 100 nm was formed on the lamination so as to be oriented toward a (111) plane by a sputtering method.

Next, the piezoelectric film 70 was formed on the first electrode 60 by a spin coating method. The method is as follows. First, respective n-octane solutions of barium 2-ethylhexanoate, titanium 2-ethylhexanoate, and copper 2-ethylhexanoate were mixed in a predetermined ratio to thereby prepare a precursor solution.

Next, the precursor solution was dripped on the substrate on which the titanium oxide film and the platinum film were formed, and the substrate was rotated at 1,500 rpm to thereby form a piezoelectric body precursor film (an application process). Next, the piezoelectric body precursor film was dried at a temperature of 150° C. for one minute (a drying process). Next, the dried film was degreased at a temperature of 350° C. for three minutes (a degreasing process). A process including the application, the drying, and the degreasing was performed twice, annealing was carried out at a temperature of 500° C. for five minutes by a rapid thermal annealing (RTA) device under an oxygen atmosphere, and then firing was carried out at a temperature of 800° C. for 60 minutes using an electric furnace (a firing process). Next, a process of carrying out the firing at a high temperature in a lump was repeatedly performed four times after performing the application process, the drying process, and the degreasing process twice, and therefore the piezoelectric film 70 having a thickness of 800 nm was wholly formed by applying eight times in total.

Next, a platinum film (second electrode 80) with a thickness of 100 nm as the second electrode 80 was formed on the piezoelectric film 70 by a DC sputtering, and therefore a piezoelectric element 300 including a piezoelectric material that is barium titanate, contains Ba and Ti at 1:1 (a molar ratio), and Cu of 1 mol % with respect to Ti, specifically, the piezoelectric film 70 having a perovskite structure of $BaTiO_3$: Cu=1:0.01 (a molar ratio) was formed.

Example 2

The same operation as that of Example 1 was performed except that a mixing ratio of barium 2-ethylhexanoate, titanium 2-ethylhexanoate, and copper 2-ethylhexanoate of the precursor solution was changed, and a complex oxide including the piezoelectric material that is barium titanate, contains Ba and Ti at 1:1 (a molar ratio), and contains Cu of 2 mol % with respect to Ti was used as the piezoelectric film 70.

Example 3

The same operation as that of Example 1 was performed except that a mixing ratio of barium 2-ethylhexanoate, titanium 2-ethylhexanoate, and copper 2-ethylhexanoate of the precursor solution was changed, and a complex oxide including the piezoelectric material that is barium titanate, contains Ba and Ti at 1:1 (a molar ratio), and contains Cu of 3 mol % with respect to Ti was used as the piezoelectric film 70.

Example 4

The same operation as that of Example 1 was performed except that firing conditions using an electric furnace in the firing process were a temperature 950° C. for 60 minutes.

Example 5

The same operation as that of Example 1 was performed except that firing conditions using an electric furnace in the firing process were a temperature 900° C. for 60 minutes.

Example 6

The same operation as that of Example 1 was performed except that firing conditions using an electric furnace in the firing process were a temperature 850° C. for 60 minutes.

Comparative Example 1

The same operation as that of Example 1 was performed except that the precursor solution into which the copper 2-ethylhexanoate was not mixed was used, and therefore the piezoelectric element 300 including the piezoelectric material that is barium titanate and contains Ba and Ti at 1:1 (a molar ratio), specifically, the piezoelectric film 70 having a perovskite structure of $BaTiO_3$ was formed.

Comparative Example 2

The same operation as that of Comparative Example 1 was performed except that firing conditions using an electric furnace in the firing process were a temperature 950° C. for 60 minutes.

Test Example 1

Figure 9:
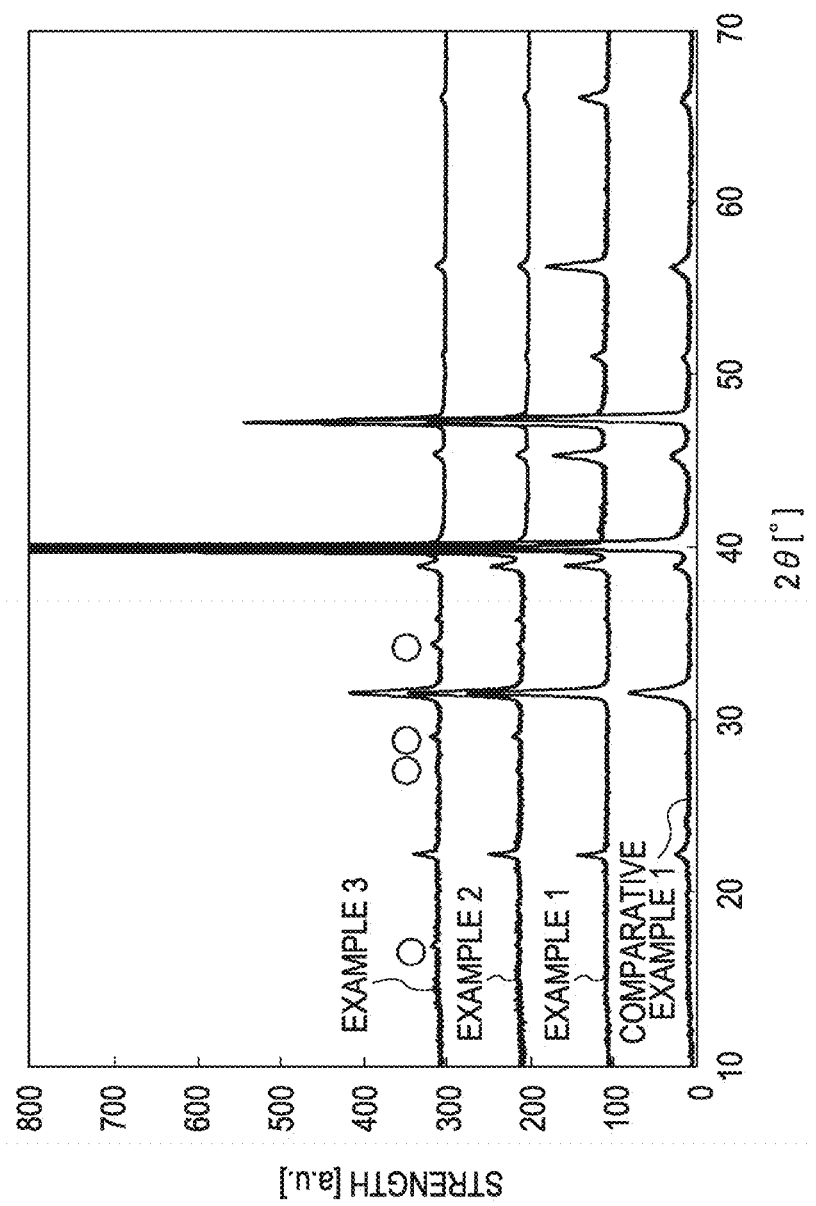
FIG. 9 is a drawing showing an X-ray diffraction pattern according to an example and a comparative example.

With respect to each of the piezoelectric elements of Examples 1 to 6 and Comparative Examples 1 and 2, "D8 Discover" manufactured by Bruker AXS was used, and CuKα rays were used as an X-ray source, thereby obtaining an X-ray diffraction pattern of the piezoelectric film 70 at room temperature (25° C.). An example of the results is shown in FIG. 9. In FIG. 9, a peak where ○ is affixed is a peak derived from a heterogenous phase different from the perovskite structure.

As a result, in all of Examples 1 to 6 and Comparative Examples 1 and 2, a peak derived from the perovskite structure and a peak derived from the substrate were observed. The intensity of the peak derived from the perovskite structure of Examples 1 to 3 was highest in Example 1, and weakest in Example 2 and Example 3 in turn, and therefore it was found that crystallinity of Example 1 was superior. In addition, in Examples 1 and 4 to 6 in which a proportion of Cu was 1 mol % or less with respect to Ti, the peak derived from the heterogenous phase different from the perovskite structure was observed, but in Examples 2 and 3 in which a proportion of Cu was 2 mol % and 3 mol % with respect to Ti, a peak derived from dependence was observed.

Test Example 2

Figure 10A:
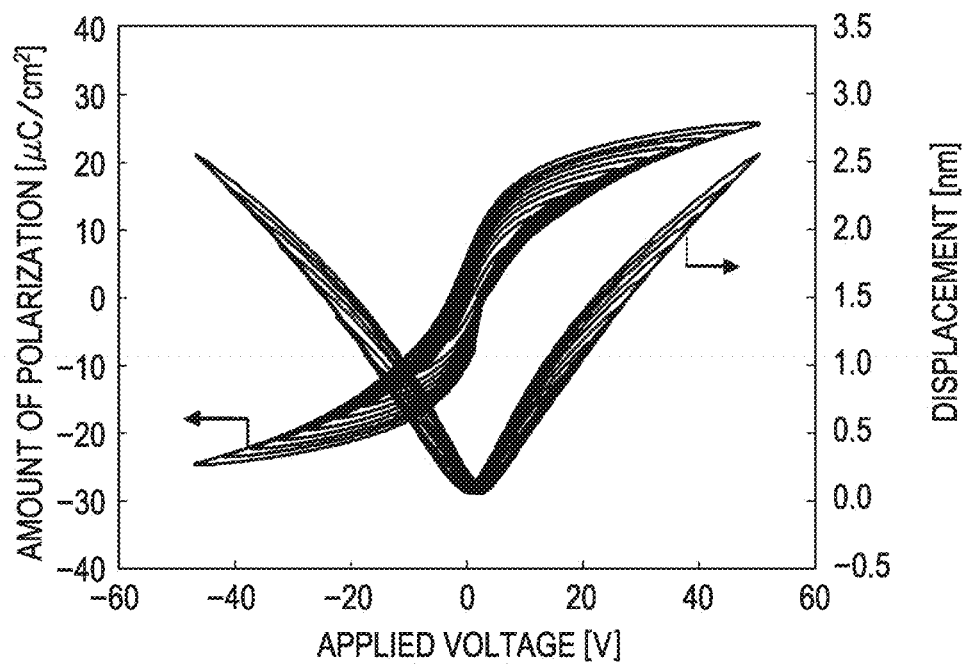
FIGS. 10A and 10B are drawings showing a P-V curved line and an S-V curved line according to an example and a comparative example.
Figure 10B:
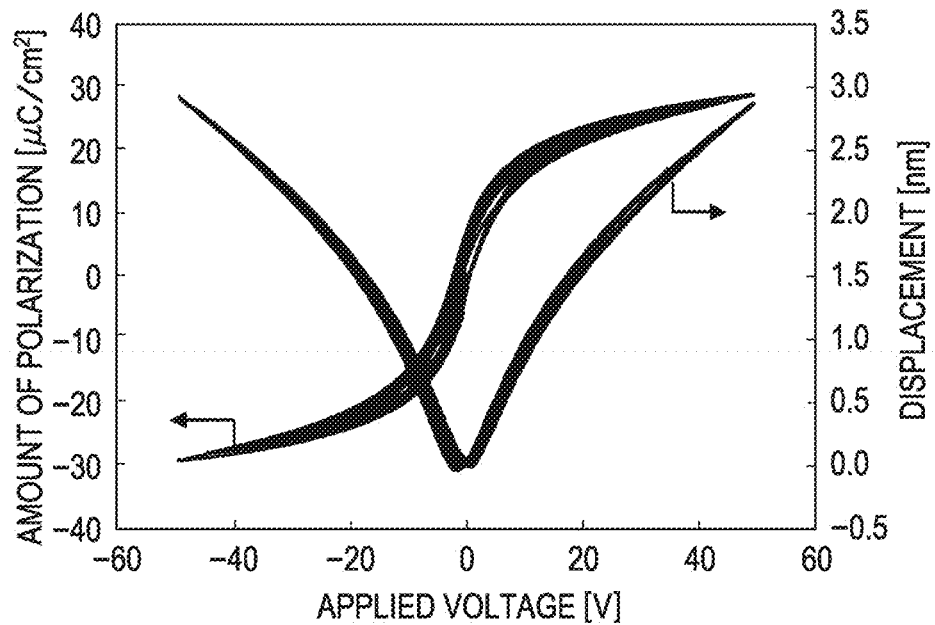

With respect to each of the piezoelectric elements of Examples 1 to 6 and Comparative Examples 1 and 2, "FCE-1 A" manufactured by TOYO and electrodes pattern of φ=400 μm were used, and a triangular wave of a frequency of 1 kHz was applied at room temperature, thereby obtaining a relationship between P (amount of polarization) and V (voltage). As an example of the results, Comparative Example 2 is shown in FIG. 10A, and Example 4 is shown in FIG. 10B. As a result, in Examples 1 to 6, a superior hysteresis curve was shown, and in Comparative Examples 1 and 2, a leak current was slightly larger compared to Examples 1 to 6.

Test Example 3

With respect to each of the piezoelectric elements of Examples 1 to 6 and Comparative Examples 1 and 2, a displacement measuring device (DBLI) manufactured by Aguzakuto was used, electrodes pattern of φ=500 μm was used at room temperature, and a voltage of a frequency of 1 kHz was applied, thereby obtaining a relationship (S-V curve) between S (an electric filed induced strain (amount of displacement)) and V (voltage). As an example of the results, Comparative Example 2 is shown in FIG. 10A, and Example 4 is shown in FIG. 10B. From the S-V curve, an amount of distortion ((an amount of displacement of the piezoelectric film 70/a film thickness of the piezoelectric film 70)×100) was obtained when an electric field 400 kV/cm was applied. The results are shown in Table 1.

As a result, as shown in Table 1, in Examples 1 to 6 containing Cu at less than or equal to 3 mol % with respect to Ti, the amount of distortion was significantly higher compared to Comparative Examples 1 and 2 each having the same firing conditions. In addition, Example 1 in which the heterogenous phase that is not a perovskite structure has higher distortion than Examples 2 and 3 in which the heterogenous phase is observed.

TABLE 1

| | Mol % of Cu with respect to Ti | Firing conditions using electric furnace | Amount of distortion (%) |
|---|---|---|---|
| Comparative Example 1 | 0 | 800° C. 60 min | 0.13 |
| Comparative Example 2 | 0 | 950° C. 60 min | 0.21 |
| Example 1 | 1 | 800° C. 60 min | 0.19 |
| Example 2 | 2 | 800° C. 60 min | 0.16 |
| Example 3 | 3 | 800° C. 60 min | 0.15 |
| Example 4 | 1 | 950° C. 60 min | 0.28 |
| Example 5 | 1 | 900° C. 60 min | 0.207 |
| Example 6 | 1 | 850° C. 60 min | 0.196 |

Example 7

The same operation as that of Example 1 was performed except that a precursor solution into which respective n-octane solutions of barium 2-ethylhexanoate, titanium 2-ethylhexanoate, copper 2-ethylhexanoate, lithium 2-ethylhexanoate, and boron 2-ethylhexanoate were mixed in a predetermined ratio was used, and the firing using the electric furnace was not carried out under firing conditions using the RTA device in the firing process such as at a temperature of 850° C. for five minutes, and therefore the piezoelectric element 300 including the piezoelectric material that is barium titanate, contains Ba and Ti at 1:1 (a molar ratio), contains Cu of 1 mol % with respect to Ti, contains Li of 1 mol % with respect to Ti, and contains B of 1 mol % with respect to Ti, specifically, the piezoelectric film 70 having the perovskite structure of $BaTiO_3$:Cu:Li:B=1:0.01:0.01:0.01 (a molar ratio) was formed.

Example 8

The same operation as that of Example 7 was performed except that a mixing ratio of barium 2-ethylhexanoate, titanium 2-ethylhexanoate, copper 2-ethylhexanoate, lithium 2-ethylhexanoate, and boron 2-ethylhexanoate of the precursor solution was changed, and a complex oxide including the piezoelectric material that is barium titanate, and contains Ba and Ti at 1:1 (a molar ratio), Cu of 1 mol % with respect to Ti, Li of 2 mol % with respect to Ti, and B of 2 mol % with respect to Ti was used as the piezoelectric film 70.

Example 9

The same operation as that of Example 7 was performed except that a mixing ratio of barium 2-ethylhexanoate, titanium 2-ethylhexanoate, copper 2-ethylhexanoate, lithium 2-ethylhexanoate, and boron 2-ethylhexanoate of the precursor solution was changed, and a complex oxide including the piezoelectric material that is barium titanate, and contains Ba and Ti at 1:1 (a molar ratio), Cu of 1 mol % with respect to Ti, Li of 3 mol % with respect to Ti, and B of 3 mol % with respect to Ti was used as the piezoelectric film 70, and firing conditions using the RTA device in the firing process were a temperature of 800° C. for five minutes.

Example 10

The same operation as that of Example 7 was performed except that a mixing ratio of barium 2-ethylhexanoate, titanium 2-ethylhexanoate, copper 2-ethylhexanoate, lithium 2-ethylhexanoate, and boron 2-ethylhexanoate of the precursor solution was changed, and a complex oxide including the piezoelectric material that is barium titanate, and contains Ba and Ti at 1:1 (a molar ratio), Cu of 1 mol % with respect to Ti, Li of 5 mol % with respect to Ti, and B of 5 mol % with respect to Ti was used as the piezoelectric film 70, and firing conditions using the RTA device in the firing process were a temperature of 800° C. for five minutes.

Comparative Example 3

The same operation as that of Example 7 was performed except that the precursor solution in which copper 2-ethylhexanoate, lithium 2-ethylhexanoate, and boron 2-ethylhexanoate were not mixed was used, and the piezoelectric element 300 including the piezoelectric material that is barium titanate and contains Ba and Ti at 1:1 (a molar ratio), specifically, the piezoelectric film 70 having a perovskite structure of $BaTiO_3$ was formed.

Comparative Example 4

The same operation as that of Comparative Example 3 was performed except that firing conditions using the RTA device in the firing process were a temperature 950° C. for five minutes.

Test Example 4

Figure 11:
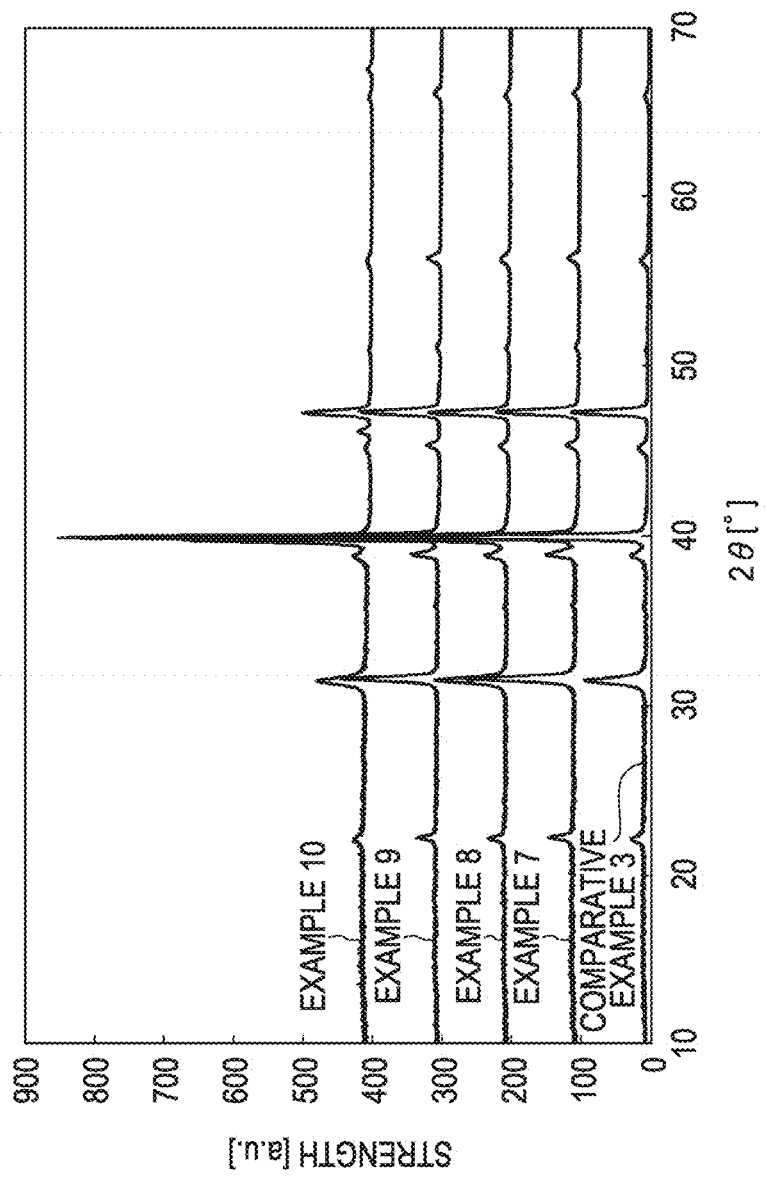
FIG. 11 is a drawing showing an X-ray diffraction pattern according to an example and a comparative example.

With respect to each of the piezoelectric elements of Examples 7 to 10 and Comparative Examples 3 and 4, "D8 Discover" manufactured by Bruker AXS was used, and CuKα rays were used as an X-ray source, thereby obtaining an X-ray diffraction pattern of the piezoelectric film 70 at room temperature (25° C.). An example of the results is shown in FIG. 11.

As a result, in all of Examples 7 to 10 and Comparative Examples 3 and 4, a peak derived from the perovskite structure and a peak derived from the substrate were observed, and a peak derived from a heterogenous phase different from the perovskite structure was not observed.

Test Example 5

With respect to each of the piezoelectric elements of Examples 7 to 10 and Comparative Examples 3 and 4, "FCE-1A" manufactured by TOYO and electrodes pattern of ϕ=400 μm were used, and a triangular wave of a frequency of 1 kHz was applied at room temperature, thereby obtaining a relationship between P (amount of polarization) and V (voltage).

Figure 12A:
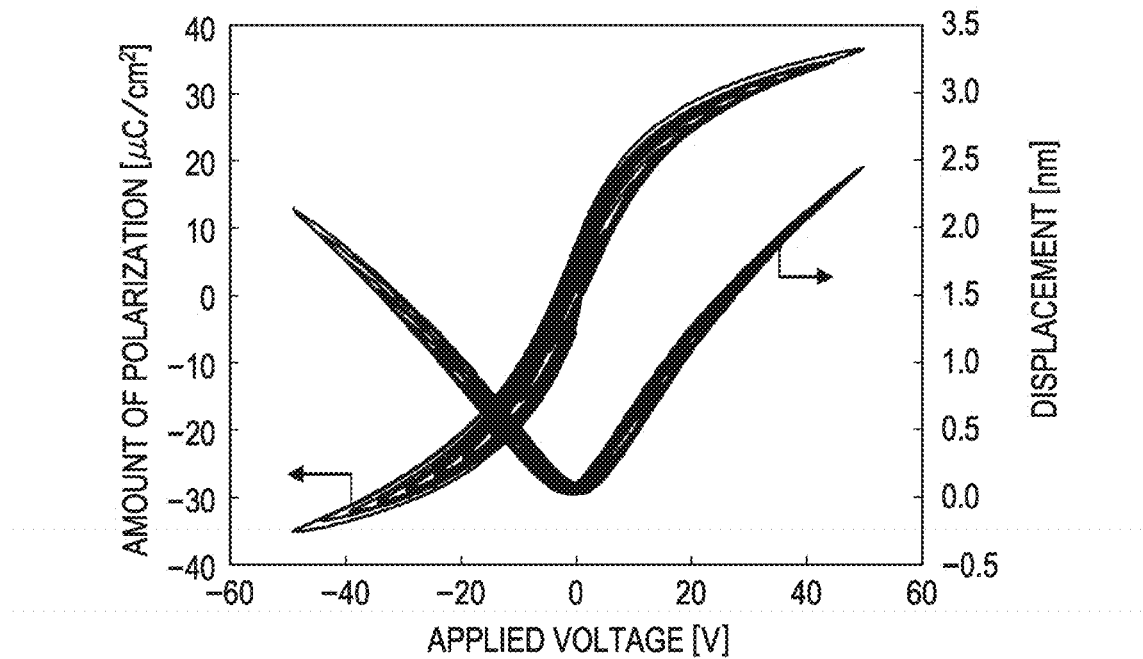
FIGS. 12A and 12B are drawings showing a P-V curved line and an S-V curved line according to an example and a comparative example.
Figure 12B:
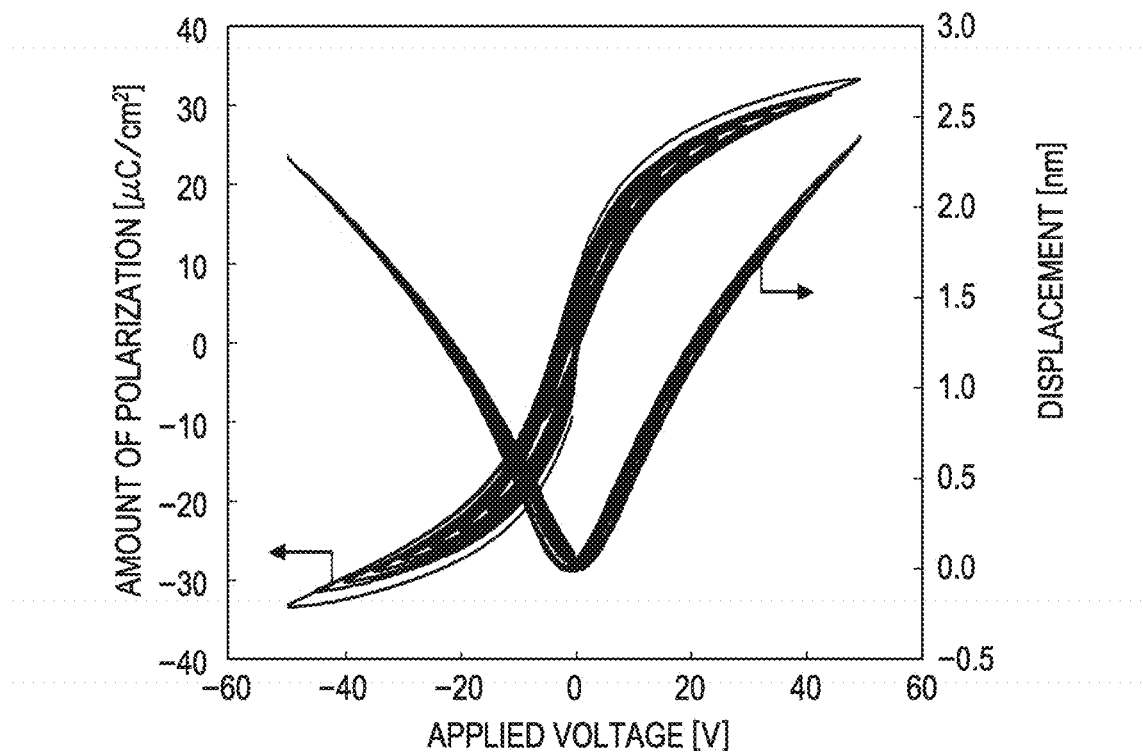

As an example of the results, Comparative Example 4 is shown in FIG. 12A, and Example 9 is shown in FIG. 12B. As a result, in Examples 7 to 10, a superior hysteresis curve was shown in the same manner as that of Comparative Examples 3 and 4.

Test Example 6

With respect to each of the piezoelectric elements of Examples 7 to 10 and Comparative Examples 3 and 4, a displacement measuring device (DBLI) manufactured by Aguzakuto was used, electrodes pattern of ϕ=500 μm was used at room temperature, and a voltage of a frequency of 1 kHz was applied, thereby obtaining a relationship (S-V curve) of S (an electric filed induced strain (amount of displacement)) and V (voltage). As an example of the results, Comparative Example 4 is shown in FIG. 12A, and Example 9 is shown in FIG. 12B. From each S-V curve, an amount of distortion ((an amount of displacement of the piezoelectric film 70/a film thickness of the piezoelectric film 70)×100) was obtained when an electric field 400 kV/cm was applied. The results are shown in Table 2.

As a result, as shown in Table 2, in Examples 7 and 8 containing Cu at less than or equal to 3 mol % with respect to Ti, the amount of distortion was significantly higher compared to Comparative Examples 3 and 4 having the same firing conditions. In addition, the amount of distortion increased as the firing temperature increased, but in Examples 9 and 10 in which Cu at less than or equal to 3 mol % with respect to Ti was contained and the firing temperature was 800° C., the amount of distortion of equal to or greater than those of Comparative Examples 3 and 4 was shown compared to Comparative Examples 3 and 4 in which the firing temperature was 850° C. or 950° C.

Test Example 7

In Examples 7 to 10 and Comparative Examples 3 and 4, with respect to the piezoelectric film 70 in a state in which the second electrode 80 was not formed, a cross-section immediately after forming the piezoelectric film 70 was observed by a scanning electron microscope (SEM) at a magnification of 50,000 times. When a case in which crystal grains were grown to large extent was ○, a case in which the crystal grains were not grown to a large extent was Δ, and a case in which the crystal grains were hardly grown was x, the grain growth was evaluated. When a case in which the crystal grains were clogged without gaps was ○, a case in which a small number of pores are present was Δ, and a case in which a large number of pores were present was x, denseness was evaluated. The evaluation results are shown in Table 2. In addition, as an example of the results, a result of Comparative Example 3 is shown in FIG. 13A, a result of Comparative Example 4 is shown in FIG. 13B, and a result of Example 9 is shown in FIG. 13C.

Figure 13A:
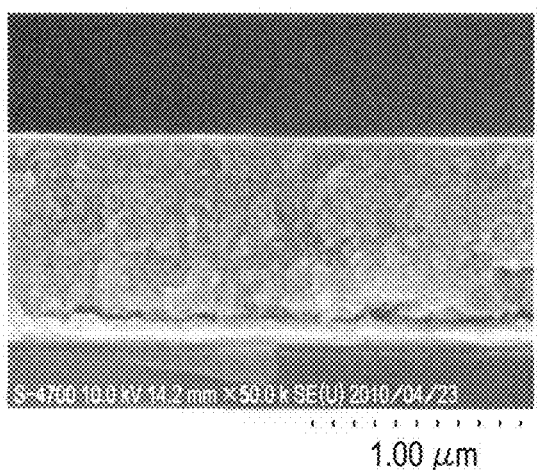
FIGS. 13A to 13C are photographs obtained by observing a cross section of a piezoelectric film according to an example and a comparative example.
Figure 13B:
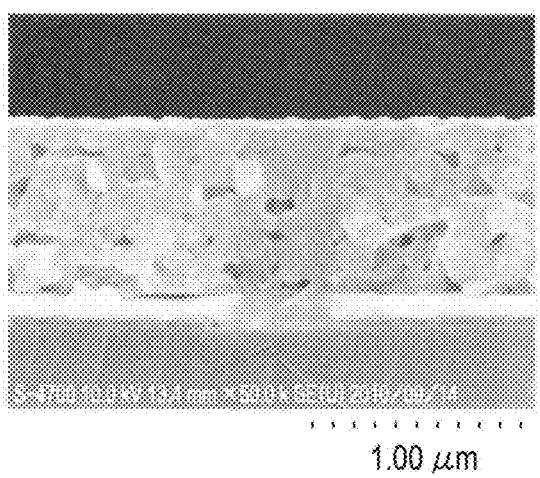
Figure 13C:
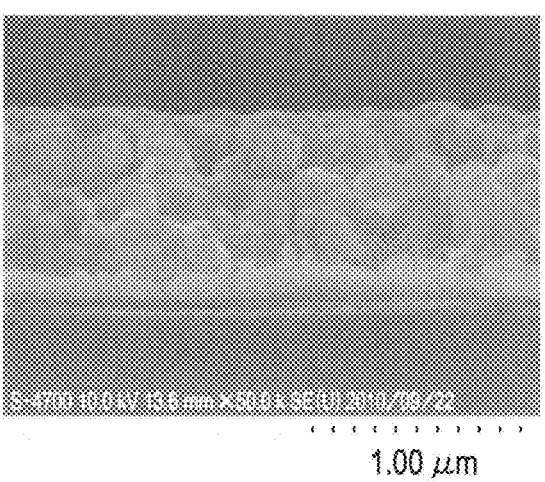

As a result, as shown in Table 2 and FIGS. 13A to 13C, in Examples 8 to 10 which contain Cu at less than or equal to 3 mol % with respect to Ti, Li of 2 mol % to 5 mol %, and B of 2 mol % to 5 mol %, the crystal grains were large and dense even though a firing time in the RTA device was short and the firing temperature of 800° C. to 850° C. was low. Meanwhile, in Comparative Examples 3 and 4 which do not contain Cu, Li, and B or Example 7 which contains a small amount of Li and B, the crystal grains were small and gaps were opened compared to Examples 8 to 10. In addition, in Examples 8 to 10, cracks were not generated, but in Example 7, cracks were generated. In Examples 8 to 10, the growth of the crystal grains was promoted, and therefore it has been estimated that the generation of the cracks was suppressed.

TABLE 2

| | Mol % of Cu with respect to Ti | Mol % of Li with respect to Ti | Mol % of B with respect to Ti | Firing conditions of RTA | Grain growth | Denseness | Amount of distortion (%) |
|---|---|---|---|---|---|---|---|
| Comparative Example 3 | 0 | 0 | 0 | 850° C. 5 min | x | x | 0.12 |
| Comparative Example 4 | 0 | 0 | 0 | 950° C. 5 min | Δ | Δ | 0.20 |
| Example 7 | 1 | 1 | 1 | 850° C. 5 min | Δ | x | 0.19 |
| Example 8 | 1 | 2 | 2 | 850° C. 5 min | ○ | ○ | 0.21 |
| Example 9 | 1 | 3 | 3 | 800° C. 5 min | ○ | ○ | 0.24 |
| Example 10 | 1 | 5 | 5 | 800° C. 5 min | ○ | ○ | 0.13 |

Example 11

First, a silicon oxide ($SiO_2$) film was formed on a surface of a (100) single crystal silicon (Si) substrate by thermal oxidation. Next, titanium oxide with a thickness of 40 nm was laminated on the $SiO_2$ film, and a platinum film (the first electrode 60) with a thickness of 100 nm was formed on the lamination so as to be oriented toward a (111) plane by a sputtering method.

Next, the piezoelectric film 70 was formed on the first electrode 60 by a spin coating method. The method is as follows. First, respective n-octane solutions of barium 2-ethylhexanoate, titanium 2-ethylhexanoate, copper 2-ethylhexanoate, lithium 2-ethylhexanoate, and boron 2-ethylhexanoate were mixed in a predetermined ratio to thereby prepare a precursor solution.

Next, the precursor solution was dripped on the substrate on which the titanium oxide film and the platinum film were formed, and the substrate was rotated at 1,500 rpm to thereby form a piezoelectric body precursor film (an application process). Next, the piezoelectric body precursor film was dried at a temperature of 150° C. for one minute (a drying process). Next, the dried film was degreased at a temperature of 350° C. for three minutes (a degreasing process). Next, firing was carried out at a temperature of 800° C. for five minutes by a rapid thermal annealing (RTA) device under an oxygen atmosphere (a firing process). Next, a series of operations including the application process, the drying process, the degreasing process, and the firing process were repeatedly performed 14 times, and therefore the piezoelectric film 70 having a thickness of 1,400 nm was wholly formed by applying 14 times in total.

Next, a platinum film (second electrode 80) with a thickness of 100 nm as the second electrode 80 was formed on the piezoelectric film 70 by a DC sputtering, and therefore a piezoelectric element 300 including a piezoelectric material that is barium titanate, contains Ba and Ti at 1:1 (a molar ratio), and Cu of 1 mol % with respect to Ti, Li of 3 mol % with respect to Ti, and B of 3 mol % with respect to Ti, specifically, the piezoelectric film 70 having a perovskite structure of $BaTiO_3$:Cu:Li:B=1:0.01:0.03:0.03 (a molar ratio) was formed.

Example 12

The same operation as that of Example 11 was performed except that a process including the application process, the drying process, and the degreasing process was repeatedly performed twice without performing the series of operations including the application process, the drying process, the degreasing process, and the firing process, firing was carried out at a temperature of 800° C. for five minutes under an oxygen atmosphere using the RTA device, the application process, the drying process, and the degreasing process were repeatedly performed twice, and then the firing process was repeatedly performed at a high temperature in a lump seven times, thereby forming the piezoelectric film 70 by applying 14 times in total.

Test Example 8

With respect to each of the piezoelectric elements of Examples 11 and 12, "D8 Discover" manufactured by Bruker AXS was used, and CuKα rays were used as an X-ray source, thereby obtaining an X-ray diffraction pattern of the piezoelectric film 70 at room temperature (25° C.). An example of the results is shown in FIG. 14. As a result, in Examples 11 and 12, a peak derived from the perovskite structure and a peak derived from the substrate were observed. In addition, a peak derived from a heterogenous phase different from the perovskite structure was not observed.

Test Example 9

In Examples 11 to 12, with respect to the piezoelectric film 70 in a state in which the second electrode 80 was not formed, a cross-section immediately after forming the piezoelectric film 70 was observed by a scanning electron microscope (SEM) at a magnification of 50,000 times. As an example of the results, the result of Example 12 is shown in FIG. 15A, and the result of Example 11 is shown in FIG. 15B. In FIGS. 15A and 15B, an upper portion is a cross-section photograph and a lower portion is a surface photograph.

As a result, as shown in FIGS. 15A and 15B, in Example 11 in which the firing was carried out for each layer, columnar crystals were formed, and crystal grain diameters were uniform. Meanwhile, in Example 12 in which two layers were fired in a lump, granular crystals which were not columnar crystals were formed, and crystal grain diameters were not uniform compared to Example 11.

Test Example 10

With respect to each of the piezoelectric elements of Examples 11 and 12, "FCE-1 A" manufactured by TOYO and electrodes pattern of $\phi$=500 μm were used, and a triangular wave of a frequency of 1 kHz was applied at room temperature, thereby obtaining a relationship between P (amount of polarization) and V (voltage). As a result, in Examples 11 and 12, a superior hysteresis curve was shown.

Test Example 11

With respect to each of the piezoelectric elements of Examples 11 and 12, a displacement measuring device (DBLI) manufactured by Aguzakuto was used, electrodes pattern of $\phi$=500 μm was used at room temperature, and a voltage of a frequency of 1 kHz was applied, thereby obtaining a relationship (S-V curve) between S (an electric filed induced strain (amount of displacement)) and V (voltage). As a result, in Examples 11 and 12, an amount of distortion was high.

In addition, from the results of Examples 10 and 11, a relationship between a maximum amount of polarization (referred to as $P_{max}$ in FIGS. 16A and 16B) and an amount of displacement with respect to a positive applied voltage was obtained. As an example of the results, Example 12 is shown in FIG. 16A, and Example 11 is shown in FIG. 16B.

Figure 16A:
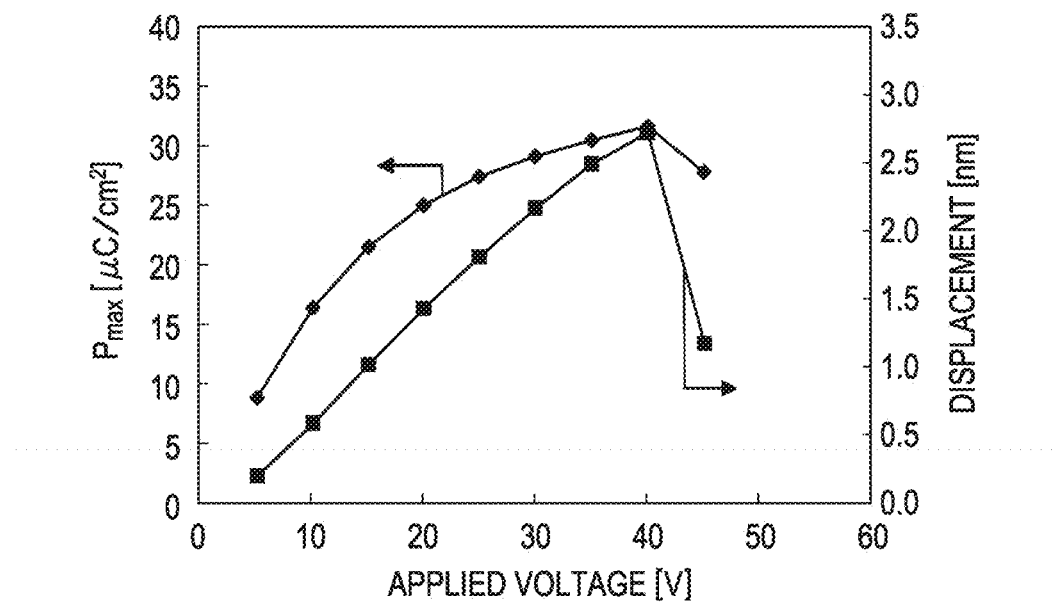
FIGS. 16A and 16B are drawings showing a relationship between a maximum amount of polarization and an amount of displacement.
Figure 16B:
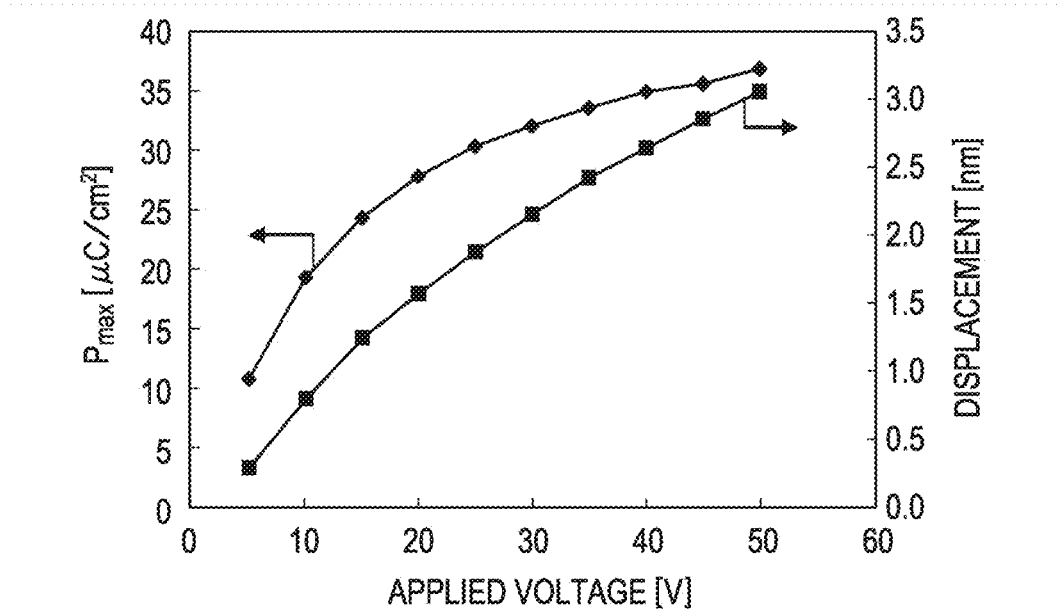

As a result, as shown in FIGS. 16A and 16B, in Example 11 in which the firing was carried out for each layer, it has been that even though a voltage up to about 50 V was applied, the piezoelectric element was not destroyed and excellent pressure resistance was exhibited. Meanwhile, in Example 12 in which two layers were fired in a lump, it has been found that both the maximum amount of polarization and the amount of displacement were rapidly reduced when exceeding about 40 V, and pressure resistance was deteriorated compared to Example 11.

Other Embodiments

As above, an embodiment of the invention has been described, but a basic configuration of the invention is not limited to those described above. For example, in the embodiment described above, the silicon single crystal substrate was described as the flow passage forming substrate 10, but the invention is not particularly limited thereto. For example, an SOI substrate, or a material such as glass or the like may be used.

In addition, in the above-described embodiment, the piezoelectric element 300 obtained by laminating the first electrode 60, the piezoelectric film 70, and the second electrode 80 on the substrate (the flow passage forming substrate 10) in turn has been described, but the invention is not limited thereto.

For example, the invention may be applied even to a longitudinal oscillation piezoelectric element obtained in such a manner that a piezoelectric material and electrodes forming material are alternately laminated so as to be elongated/contracted in an axial direction.

Figure 17:
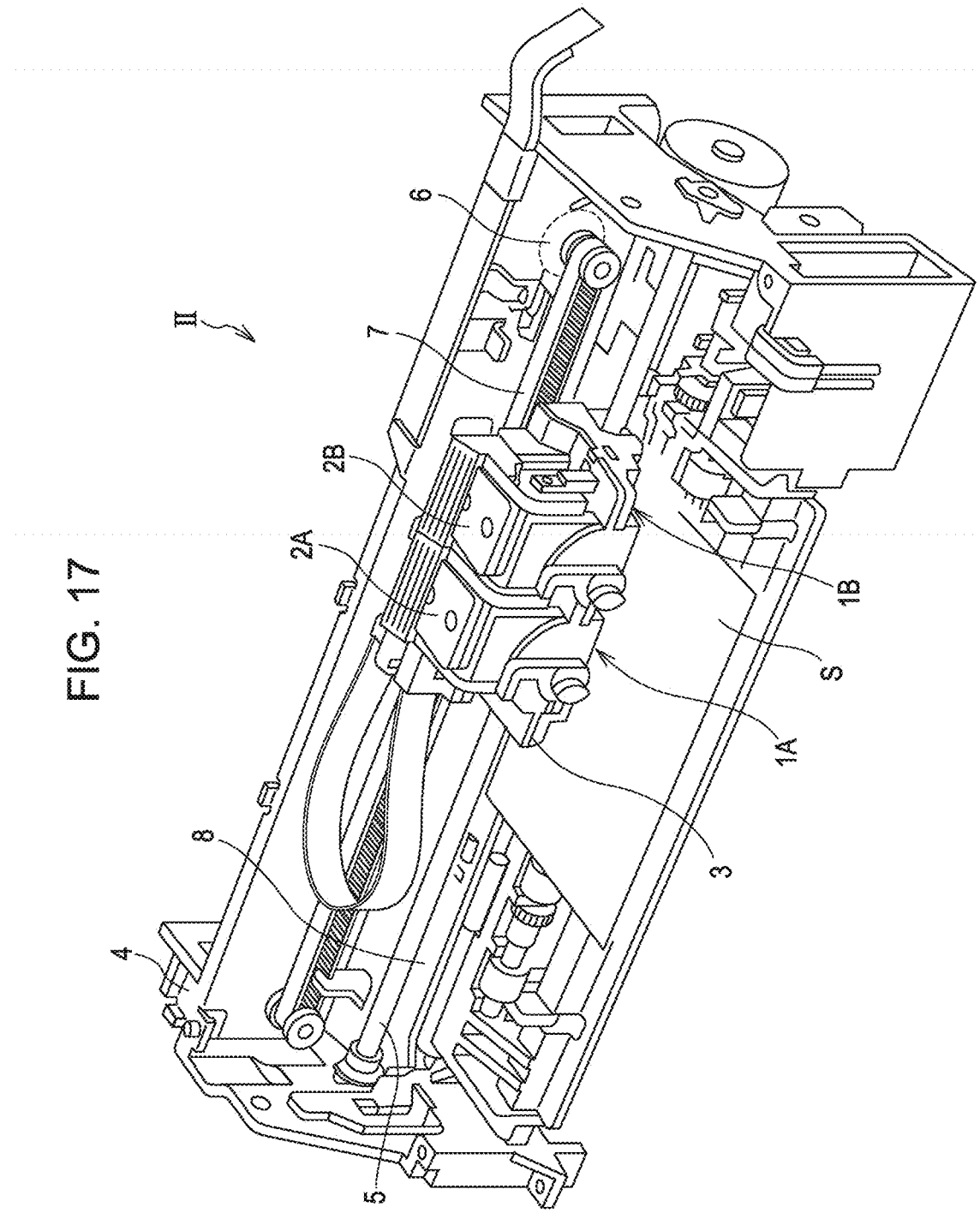
FIG. 17 is a drawing showing a schematic configuration of a recording device according to an embodiment of the invention.

In addition, in the ink jet recording head according to the above-described embodiments, a part of a recording head unit including an ink flow passage communicating with an ink cartridge or the like is constituted, and mounted on an ink jet recording device. FIG. 17 is a schematic view showing an example of the ink jet recording device.

In the ink jet recording device II shown in FIG. 17, cartridges 2A and 2B which constitute an ink supply means are detachably mounted on recording head units 1A and 1B having the ink jet recording head I, and a carriage 3 on which the recording head units 1A and 1B are mounted is provided on a carriage shaft 5 attached to a main body 4 of the apparatus so as to freely move in the axial direction. The recording head units 1A and 1B respectively discharge a black ink composition and a color ink composition.

A driving force of a driving motor 6 is transmitted to the carriage 3 through a plurality of gears, which are not shown, and a timing belt 7, and therefore the carriage 3 on which the recording head units 1A and 1B are mounted is moved along the carriage shaft 5. Meanwhile, in the main body 4 of the apparatus, a platen 8 is provided along the carriage shaft 5, and a recording sheet S that is a recording medium such as paper or the like that has been fed by a paper feeding roller (not shown) may be wound around the platen 8 so as to be transported.

In addition, in the above-described embodiment, the ink jet recording head has been described as an example of the liquid ejecting head, but the invention is widely intended for general liquid ejecting heads, and thereby may be obviously applied even to the liquid ejecting head for ejecting a liquid other than the ink. As examples of the liquid ejecting head other than this, a variety of recording heads used in an image recording apparatus such as a printer, a color material ejecting head used when manufacturing a color filter such as a liquid crystal display, electrodes material ejecting head used when forming electrodes such as an organic EL display, a field emission display (FED), a bio-organic ejecting head used when manufacturing a bio chip, and the like may be given.

In addition, the piezoelectric element according to the invention is not limited to the piezoelectric element used in the liquid ejecting head, and may be used in other devices. As examples of the other devices, ultrasonic devices such as an ultrasonic transmitter, an ultrasonic motor, a temperature electric converter, a pressure electric converter, a ferroelectric transistor, a piezoelectric transformer, filters such as a cutoff filter of harmful rays such as infrared rays, an optical filter using a photonic crystalline effect due to formation of quantum dots and an optical filter using light interference of a thin film, and the like may be given. In addition, the invention may be applied to a piezoelectric element used as a sensor and a piezoelectric element used as a ferroelectric memory. As examples of the sensor in which the piezoelectric element is used, an infrared sensor, an ultrasonic sensor, a thermosensible sensor, a pressure sensor, a pressure sensor, a pyroelectricity sensor, a gyro sensor (an angular velocity sensor), and the like may be given.

The invention claimed is:

1. A liquid ejecting head that ejects liquid from nozzle openings comprising:
   a piezoelectric film; and
   a piezoelectric element with electrodes on the piezoelectric film, wherein the piezoelectric film includes a barium titanate-based composition having a perovskite structure containing barium, titanium, lithium, and copper, the copper being present in an amount that is less than or equal to 3 mol % of a titanium amount.

2. The liquid ejecting head according to claim 1, wherein the piezoelectric film includes the lithium in an amount that is more than or equal to 2 mol % and less than or equal to 5 mol % of the titanium amount, and boron in an amount that is more than or equal to 2 mol % and less than or equal to 5 mol % of the titanium amount.

3. The liquid ejecting head according to claim 2, wherein the piezoelectric film consists of columnar crystals.

4. A liquid ejecting apparatus comprising the liquid ejecting head according to claim 1.

5. A liquid ejecting apparatus comprising the liquid ejecting head according to claim 2.

6. A liquid ejecting apparatus comprising the liquid ejecting head according to claim 3.

7. A piezoelectric element comprising a piezoelectric film and electrodes on the piezoelectric film,
wherein the piezoelectric film is made from a barium titanate-based composition having a perovskite structure containing barium, titanium, lithium, and copper, the copper being present in an amount that is less than or equal to 3 mol % of a titanium amount.

8. A piezoelectric element comprising a piezoelectric film and electrodes on the piezoelectric film,
wherein the piezoelectric film is made from a barium titanate-based composition having a perovskite structure containing barium, titanium, and copper, the copper being present in an amount that is less than or equal to 3 mol % of a titanium amount; and
wherein the piezoelectric film includes lithium in an amount that is more than or equal to 2 mol % and less than or equal to 5 mol % of the titanium amount, and boron in an amount that is more than or equal to 2 mol % and less than or equal to 5 mol % of the titanium amount.

9. The piezoelectric element according to claim 8, wherein the piezoelectric film consists of columnar crystals.

10. A liquid ejecting head that ejects liquid from nozzle openings comprising the piezoelectric element of claim 8.

11. A liquid ejecting apparatus comprising the liquid ejecting head according to claim 10.

* * * * *